United States Patent
Teraguchi et al.

(10) Patent No.: US 10,128,320 B2
(45) Date of Patent: Nov. 13, 2018

(54) DISPLAY DEVICE AND ELECTRONIC APPARATUS

(71) Applicant: JOLED Inc., Tokyo (JP)

(72) Inventors: Shinichi Teraguchi, Kanagawa (JP); Manabu Kodate, Kanagawa (JP); Seonghee Noh, Kanagawa (JP)

(73) Assignee: JOLED Inc., Tokyo (JP)

( * ) Notice: Subject to any disclaimer, the term of this patent is extended or adjusted under 35 U.S.C. 154(b) by 0 days.

(21) Appl. No.: 15/833,165

(22) Filed: Dec. 6, 2017

(65) Prior Publication Data

US 2018/0108711 A1    Apr. 19, 2018

Related U.S. Application Data

(63) Continuation of application No. 13/403,063, filed on Feb. 23, 2012.

(30) Foreign Application Priority Data

Mar. 22, 2011 (JP) ................................. 2011-062920

(51) Int. Cl.

| | |
|---|---|
| *G06F 3/041* | (2006.01) |
| *H01L 27/32* | (2006.01) |
| *G06F 3/044* | (2006.01) |
| *H04N 13/305* | (2018.01) |
| *H04N 13/315* | (2018.01) |
| *H04N 13/356* | (2018.01) |

(52) U.S. Cl.
CPC ............ *H01L 27/323* (2013.01); *G06F 3/044* (2013.01); *G06F 3/0412* (2013.01); *G06F 3/0416* (2013.01); *H04N 13/305* (2018.05); *H04N 13/315* (2018.05); *H04N 13/356* (2018.05); *G06F 2203/04108* (2013.01)

(58) Field of Classification Search
CPC .. G02F 1/29; G02F 1/13; G02B 27/12; G02B 27/22; H01L 21/02; G06F 1/32; G06F 3/044; G06F 3/041
See application file for complete search history.

(56) References Cited

U.S. PATENT DOCUMENTS

| | | |
|---|---|---|
| 5,929,834 A | 7/1999 | Inoue et al. |
| 2008/0013002 A1 | 1/2008 | Hong et al. |
| 2008/0218650 A1 | 9/2008 | Koshihara et al. |

(Continued)

FOREIGN PATENT DOCUMENTS

| | | |
|---|---|---|
| CN | 101017419 A | 8/2007 |
| JP | 2010/262114 | 11/2010 |

(Continued)

OTHER PUBLICATIONS

Chinese Office Action dated Jan. 28, 2016 for corresponding Chinese Application No. 201210077581.X.

*Primary Examiner* — Pegeman Karimi
(74) *Attorney, Agent, or Firm* — Michael Best & Friedrich LLP

(57) ABSTRACT

A display device includes a pixel portion including a plurality of pixels; a display switching function portion that displays an image based on light emitted from the pixel portion, and is capable of switching a three-dimensional display and a two-dimensional display of the image; and a sensor portion that detects whether or not an object comes into contact with or approaches.

17 Claims, 24 Drawing Sheets

(56) References Cited

U.S. PATENT DOCUMENTS

| | | |
|---|---|---|
| 2008/0252720 A1 | 10/2008 | Kim et al. |
| 2008/0266388 A1 | 10/2008 | Woodgate et al. |
| 2009/0122210 A1 | 5/2009 | Im |
| 2009/0153754 A1 | 6/2009 | Jung |
| 2009/0256818 A1* | 10/2009 | Noguchi ............. G02F 1/13338 345/174 |
| 2010/0013789 A1 | 1/2010 | Chung et al. |
| 2010/0066692 A1 | 3/2010 | Noguchi et al. |
| 2010/0134426 A1* | 6/2010 | Lee ..................... G06F 3/0412 345/173 |
| 2010/0157181 A1 | 6/2010 | Takahashi |
| 2010/0182273 A1 | 7/2010 | Noguchi et al. |
| 2010/0195190 A1* | 8/2010 | Ishioka ................ G02B 26/004 359/316 |
| 2010/0238277 A1 | 9/2010 | Takahashi et al. |
| 2010/0265210 A1 | 10/2010 | Nakanishi et al. |
| 2010/0283833 A1 | 11/2010 | Yeh |
| 2010/0289765 A1 | 11/2010 | Noguchi et al. |
| 2010/0295804 A1 | 11/2010 | Takeuchi et al. |
| 2010/0302202 A1 | 12/2010 | Takeuchi et al. |
| 2010/0309162 A1 | 12/2010 | Nakanishi et al. |
| 2010/0328239 A1 | 12/2010 | Harada et al. |
| 2010/0328256 A1 | 12/2010 | Harada et al. |
| 2010/0328257 A1 | 12/2010 | Noguchi et al. |
| 2010/0328274 A1 | 12/2010 | Noguchi et al. |
| 2010/0328438 A1 | 12/2010 | Ohyama et al. |
| 2011/0001706 A1 | 1/2011 | Sanford et al. |
| 2011/0096251 A1* | 4/2011 | Son .................... G02F 1/13338 349/15 |
| 2011/0109568 A1* | 5/2011 | Wu ...................... G06F 3/0412 345/173 |
| 2011/0109622 A1 | 5/2011 | Son et al. |
| 2011/0157498 A1 | 6/2011 | Kim et al. |
| 2011/0157499 A1 | 6/2011 | Lee et al. |
| 2011/0292311 A1 | 12/2011 | Qian et al. |

FOREIGN PATENT DOCUMENTS

| | | |
|---|---|---|
| TW | 200702769 A | 1/2007 |
| TW | 200823494 A | 6/2008 |
| TW | 200903030 A | 1/2009 |
| TW | 200951548 A | 12/2009 |
| TW | 201039601 A | 11/2010 |
| WO | WO-2009/069358 | 6/2009 |

* cited by examiner

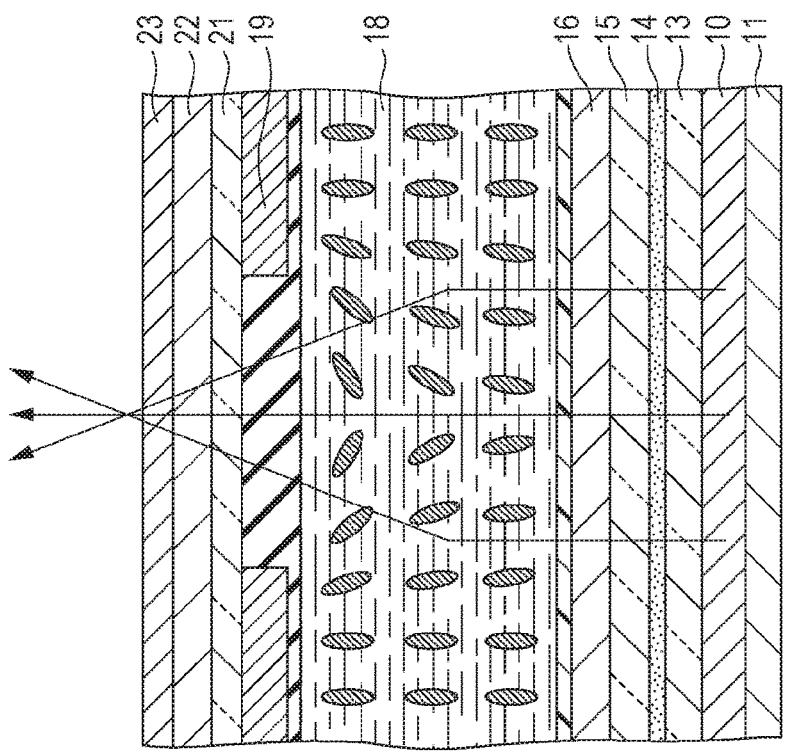
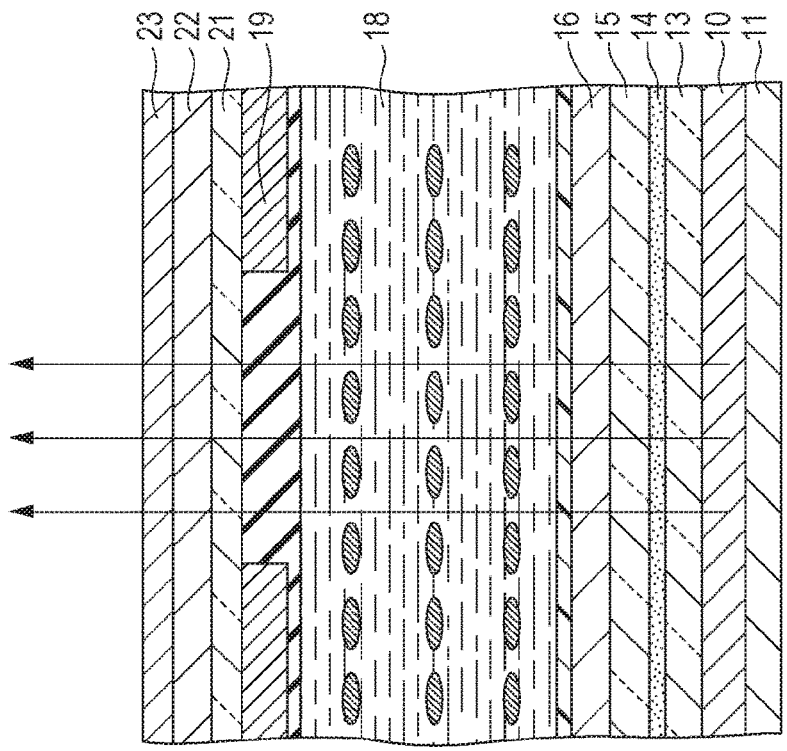

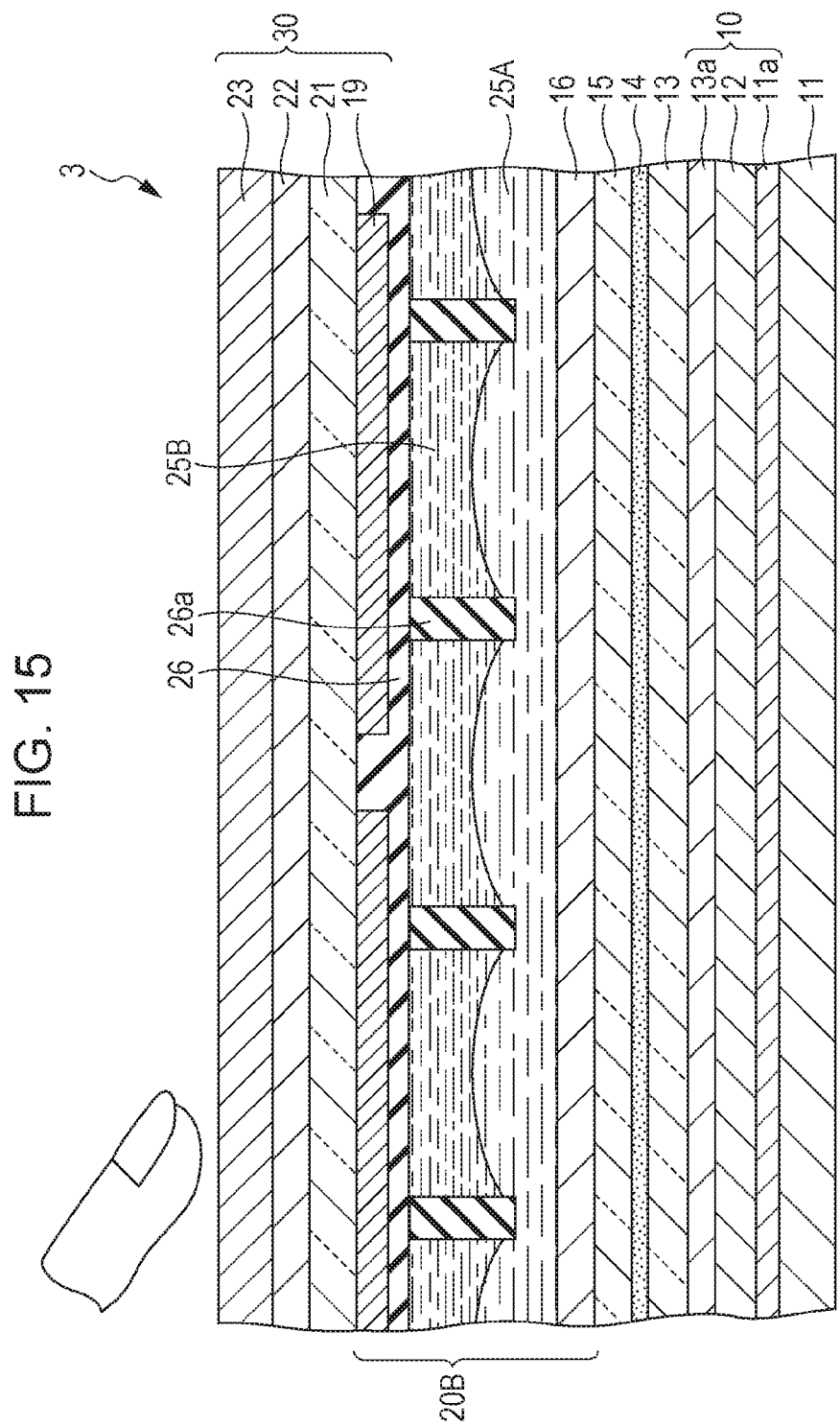

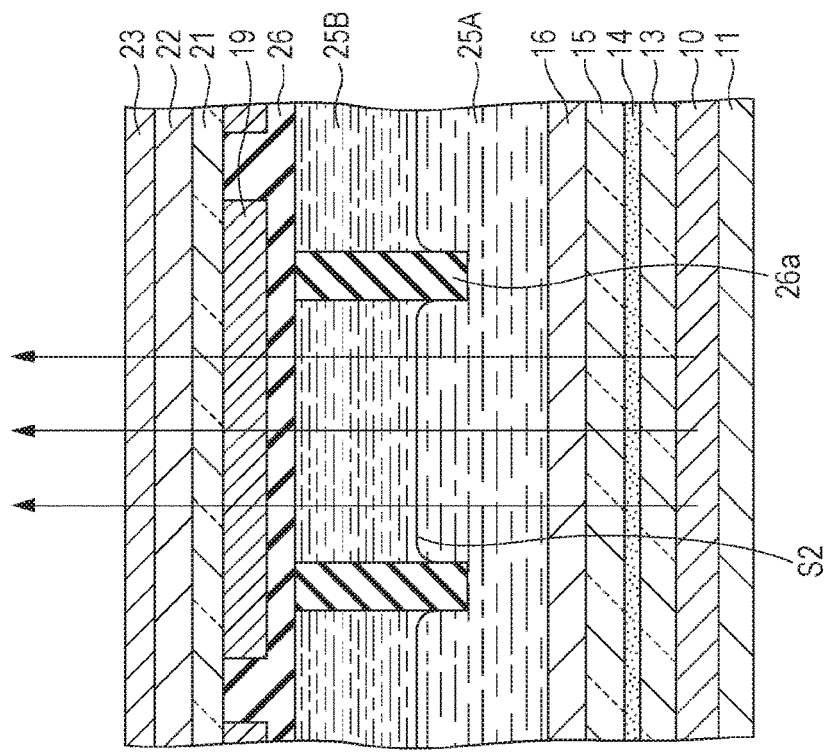
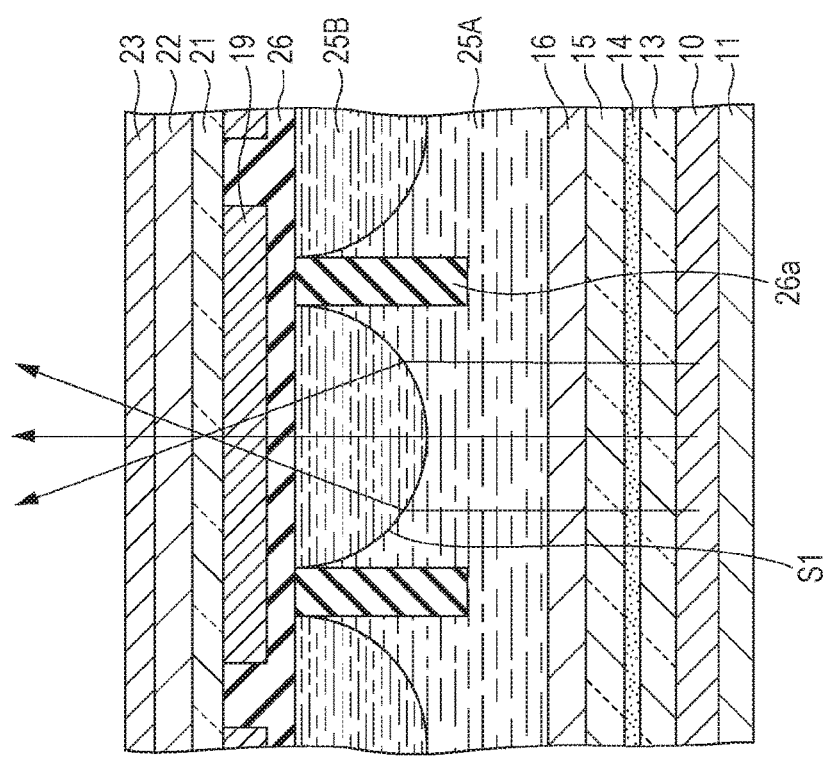

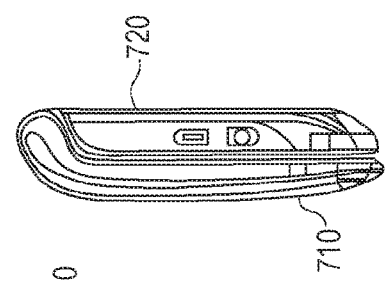
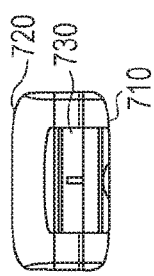
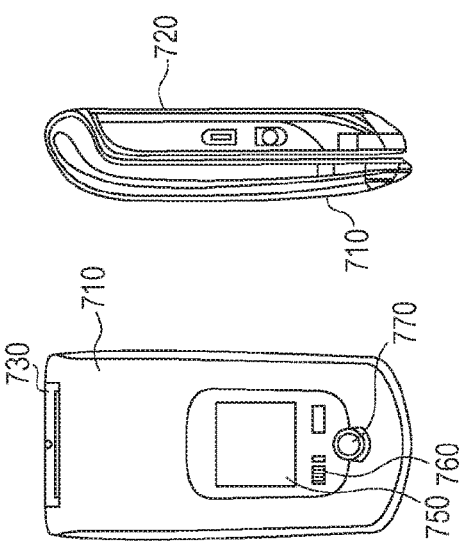
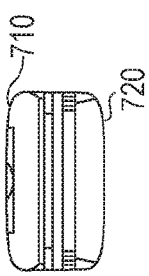
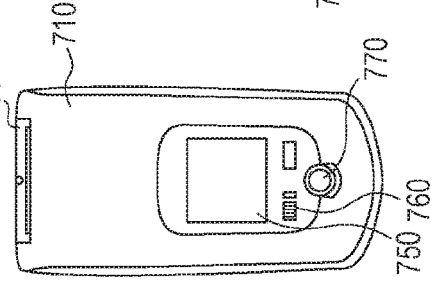
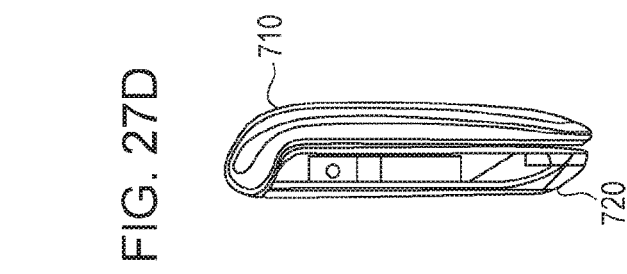
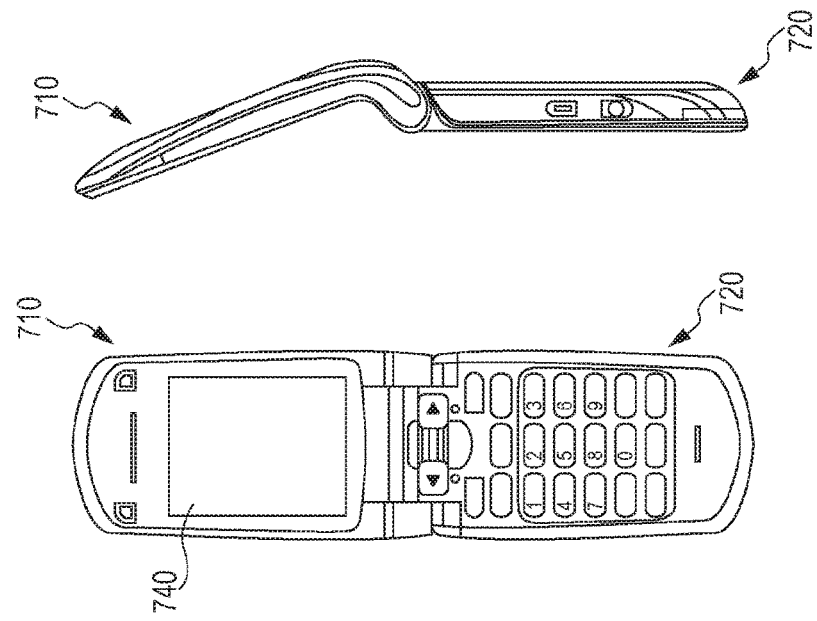

DISPLAY DEVICE AND ELECTRONIC APPARATUS

CROSS REFERENCES TO RELATED APPLICATIONS

This Application is a Continuation Application of U.S. patent application Ser. No. 13/403,063, filed Feb. 23, 2012, which claims priority to Japanese Patent Application No.: 2011-062920, filed in the Japan Patent Office on Mar. 22, 2011, the entire contents of which being incorporated herein by reference.

BACKGROUND OF THE INVENTION

1. Field of the Invention

The present invention relates to an active matrix type display device using light-emitting elements in pixels, respectively, and a method of manufacturing the same. More specifically, the invention relates to a technique for improving a power source wiring formed in a panel constituting a display device.

2. Description of the Related Art

In recent years, a plane self-emitting type display device using organic EL devices as light-emitting elements has been actively developed. The organic EL device is a device utilizing a phenomenon that when an electric field is applied across an organic thin film, the organic thin film emits a light. The organic EL device consumes a less power because it is driven with an applied voltage of 10 V or less. In addition, the organic EL device needs no illumination member and thus the light weighting and thinning thereof are readily realized because the organic EL device is a self-emitting element for emitting a light by itself. Moreover, the organic EL device operates at a very high speed because of its high response speed of several micro seconds. Thus, no afterimage in a phase of display of a moving picture occurs.

Of the plane self-emitting type display devices using organic EL devices in the pixels, respectively, especially, an active matrix type display device in which thin film transistors are formed as drive elements integrally with one another in each pixel has been actively developed. The active matrix type plane self-emitting display device, for example, is described in Japanese Patent Laid-Open Nos. 2003-255856, 2003-271095, 2004-133240, 2004-029791, and 2004-093682.

BACKGROUND

The present disclosure relates to a display device and an electronic apparatus, which have a touch sensor function.

Recently, display devices and electronic apparatuses, which are provided with a touch sensor function allowing a user to input information with a finger, a stylus, or the like (performs an object detection operation), have increased. In addition, recently, a technology in which a 3D (three-dimensional) image display function is further provided to the display device has been suggested (refer to a Pamphlet of International Publication No. 09/069358).

SUMMARY

A display device disclosed in the Pamphlet of International Publication No. 09/069358 has a configuration in which a barrier parallax (or a lenticular lens) and a touch panel are sequentially laminated above a liquid crystal panel including display pixels. That is, the display device has a configuration in which modules having an image display function, a 3D display function, and a touch sensor function, respectively, overlap each other. In this display device, it is preferable that a function, which allows not only a 3D image but also a common 2D (two-dimensional) image to be displayed, be realized.

It is desirable to provide a display device and an electronic apparatus in which an information input by a user is possible while a three-dimensional image and a two-dimensional image are displayed in a switchable manner.

According to an embodiment of the present disclosure, there is provided a display device including a pixel portion including a plurality of pixels; a display switching function portion that displays an image based on light emitted from the pixel portion, and is capable of switching a three-dimensional display and a two-dimensional display of the image; and a sensor portion that detects whether or not an object comes into contact with or approaches.

According to another embodiment of the present disclosure, there is provided an electronic apparatus including the display device according to the embodiment of the present disclosure.

In the display device and the electronic apparatus according to the embodiments of the present disclosure, the display switching function portion displays the image, which is based on the light emitted from the pixel portion including the plurality of pixels, in a switchable manner as the three-dimensional image or the two-dimensional image. In addition, the sensor portion is provided, such that it is detected whether or not an object comes into contact with or approaches while the image is displayed.

According to the display device and the electronic apparatus of the embodiments of the present disclosure, a pixel portion including a plurality of pixels, a display switching function portion that displays an image based on light emitted from the pixel portion, and is capable of switching a three-dimensional display and a two-dimensional display of the image, and a sensor portion that detects whether or not an object comes into contact with or approaches are provided. Therefore, an information input by a user may be possible while displaying the three-dimensional image and the two-dimensional image in a switchable manner.

BRIEF DESCRIPTION OF THE DRAWINGS

FIGS. 8A and 8B are schematic diagrams illustrating a display operation in a liquid crystal lens portion at the time of a 3D display and a 2D display;

FIG. 15 is a cross-sectional diagram illustrating a schematic structure of a display device according to a third embodiment of the present disclosure;

FIGS. 16A and 16B are schematic diagrams illustrating a display operation in a liquid lens portion at the time of a 3D display and a 2D display;

FIG. 23 is a perspective diagram illustrating an external appearance of a first application example of the display devices in the respective embodiments, or the like;

FIG. 27A is a front elevational view of an opened state of a fifth application example, FIG. 27B is a side elevational view thereof, FIG. 27C is an front elevational view of a closed state, FIG. 27D is a left side elevational view, FIG. 27E is a right side elevational view, FIG. 27F is a top view, and FIG. 27G is a bottom view.

DETAILED DESCRIPTION OF EMBODIMENTS

Hereinafter, an embodiment of the present disclosure will be described with reference to the accompanying drawings. In addition, description will be made in the following order.

1. First Embodiment (Example in which Driving Electrode of Liquid Crystal Lens Portion (Display Switching Function Portion) and Driving Electrode of Sensor Portion are Commonized (Four Sheets of Glass))

2. First Modification Example (Example in which Three Sheets of Glass Substrates are Used)

3. Second Modification Example (Example in which Two Sheets of Glass Substrates are Used, and Protective Layer is Provided on Pixel Portion)

4. Second Embodiment (Example in which Driving Electrode of Liquid Crystal Lens Portion and Driving Electrode of Sensor Portion are Commonized, and Counter Electrode of Liquid Crystal Lens Portion and Common Electrode of Pixel Portion are Commonized)

5. Third Embodiment (Example in which Driving Electrode of Liquid Lens Portion (Display Switching Function Portion) and Driving Electrode of Sensor Portion are Commonized)

6. Third Modification Example (Another Example of Liquid Lens Portion)

7. Fourth Modification Example (Still Another Example of Liquid Lens Portion)

8. Fourth Embodiment (Example in which Driving Electrode of Liquid Crystal Barrier Portion (Display Switching Function Portion) and Driving Electrode of Sensor Portion are Commonized)

9. Fifth Modification Example (Example in which Touch Panel is Configured by On-Cell Structure)

10. Application Example (Application Example of Touch Sensor-Mounted Display Device to Electronic Apparatus)

First Embodiment

Configuration Example of Display Device 1

Figure 1:
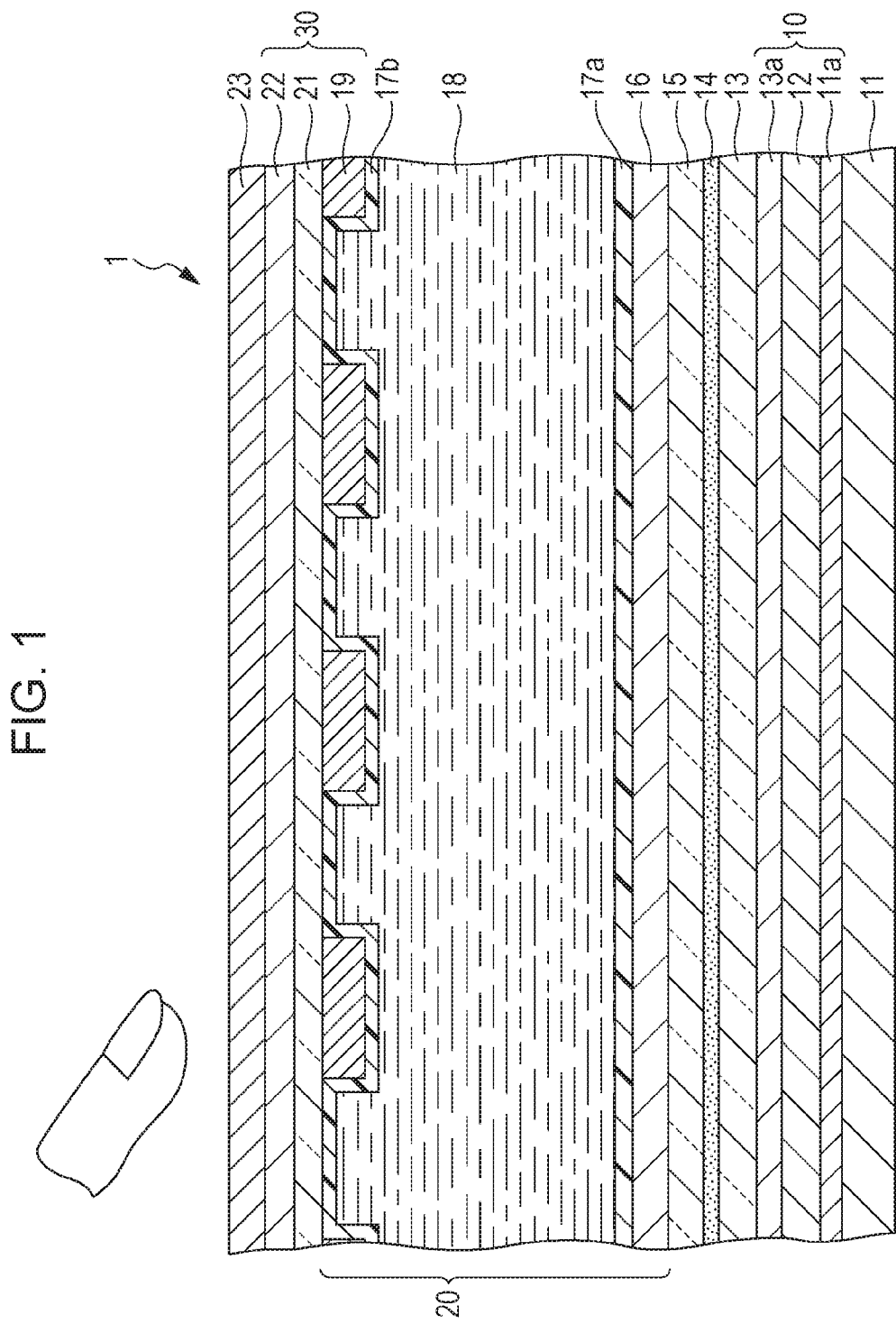
FIG. 1 is a cross-sectional diagram illustrating a schematic structure of a display device according to a first embodiment of the present disclosure.

FIG. 1 illustrates a cross-sectional structure of a display device 1 according to a first embodiment of the present disclosure. The display device 1 is, for example, an organic EL (Electroluminescence: hereinafter, referred to as an "EL") display provided with a touch sensor function. In this embodiment, a liquid crystal lens portion 20 as a display switching function portion and a touch sensor portion 30 are provided in this order above a pixel portion 10. The pixel portion 10 includes a plurality of organic EL elements as display pixels, and the sensor portion 30 has an electrostatic capacitance type touch sensor function. All of the pixel portion 10, the liquid crystal lens portion 20, and the touch sensor portion 30 are made to drive through a pair of electrodes. Hereinafter, configurations of the pixel portion 10, the liquid crystal lens portion 20, and the touch sensor portion 30 will be described.

Pixel Portion 10

The pixel portion 10 is provided on a first substrate 11 and includes a plurality of organic EL elements, for example, as pixels of R (red), G (green), and B (blue). The first substrate 11 is a circuit substrate to drive the pixel portion 10, and in the first substrate 11, peripheral circuits that make up a pixel driving unit 72 described later, and a pixel transistor, or the like are disposed. The pixel portion 10 includes at least a pixel electrode layer 11a, an organic EL layer 12, and a common electrode 13a in this order from the first substrate 11 side. In addition, a circuit configuration example of a pixel will be described later.

The pixel electrode layer 11a includes a plurality of pixel electrodes, and each of the pixel electrodes functions as an anode to inject a hole into the organic EL layer 12. This pixel electrode is formed of, for example, a metallic material having a reflectivity, for example, an elementary substance of a metal element such as silver (Ag), aluminum (Al), molybdenum (Mo), and chromium (Cr), or an alloy thereof. In addition, the pixel electrode may be formed of a transparent conductive film of an oxide (ITO) of indium and tin, an oxide (IZO) of indium and zinc, or the like. In addition, the pixel electrode may be formed of a single-layered film of a magnesium-silver (Mg—Ag) co-deposition film or a laminated film thereof. A pixel isolation film (a window film, not shown), which has an opening in correspondence with each of the pixel electrodes, is provided on the pixel electrode layer 11*a* and thereby a light-emitting region is partitioned for each pixel.

The organic EL layer 12 is a white light-emitting layer that is common to each of the pixels, and emits white light through recoupling of a hole and an electron. However, the organic EL layer 12 is not limited to the white light-emitting layer, and light-emitting layers (a red light-emitting layer, a green light-emitting layer, and a blue light-emitting layer) of respective colors may be applied for each pixel. In the case of using the white color light-emitting layer, color filters may be arranged for each pixel to take out color light of R, G, and B. The common electrode 13*a* is laminated over an entire surface of the organic EL layer 12.

The common electrode 13*a* an electrode that is common for each pixel, and functions as, for example, a cathode to inject an electron into the organic EL layer 12. The common electrode 13*a* is formed of a transparent conductive film of, for example, an oxide (ITO) of indium and tin, an oxide (IZO) of indium and zinc, or the like, or a single-layered film of a magnesium-silver (Mg—Ag) co-deposition film or a laminated film thereof. In addition, the common electrode 13*a* may be formed of, for example, a metallic material having a reflectivity, for example, an elementary substance of a metal element such as silver (Ag), aluminum (Al), molybdenum (Mo), and chromium (Cr), or an alloy thereof.

In addition, for example, a hole injection layer or a hole transport layer (all of these are not shown) may be provided between the pixel electrode layer 11*a* and the organic EL layer 12, and for example, an electron injection layer or an electron transport layer (all of these are not shown) may be provided between the common electrode 13*a* and the organic EL layer 12. In addition, a color filter layer or a black matrix layer (not shown) may be provided on the common electrode 13*a*.

Here, in this embodiment, as described above, the pixel portion 10 is sealed by a second substrate 13, and a third substrate 15 as a base material of the liquid crystal lens portion 20 is adhered above the second substrate 13 with an adhesion layer 14 interposed therebetween. The second substrate 13 and the third substrate 15 are formed of, for example, a transparent substrate such as glass.

Liquid Crystal Lens Portion 20

The liquid crystal lens portion 20 performs an image display by transmitting light emitted from the pixel portion 10, and has a function of displaying an image at that point of time in a switchable manner as a 3D image or a 2D image. The liquid crystal lens portion 20 includes a liquid crystal layer 18, for example, at a position between a counter electrode 16 and a driving electrode 19, and serves as a variable-focal length lens that allows a focal length (refraction index) to vary (allows an emission angle of a light beam to vary) in response to an applied voltage to the liquid crystal layer 18. The switching of the 3D display and the 2D display is realized by the variation in the refraction index in response to the applied voltage. Alignment films 17*a* and 17*b* are formed on liquid crystal layer 18 side surfaces of the counter electrode 16 and the driving electrode 19, respectively.

The counter electrode 16 is provided over an entire surface of the third substrate 15, and is formed of, for example, a transparent conductive film of ITO, IZO, or the like. This counter electrode 16 is an electrode to apply a driving voltage to the liquid crystal layer 18 together with the driving electrode 19, and is maintained to, for example, a fixed potential (common potential). The counter electrode 16 may be connected to a common potential line or the like, or may be grounded.

The liquid crystal layer 18 is configured by, for example, a Nematic liquid crystal and has a homogeneous alignment. The alignment films 17*a* and 17*b* control an alignment state of a liquid crystal in the liquid crystal layer 18, and is formed of, for example, polyimide or the like.

The driving electrode 19 is a driving electrode (a driving electrode for display switching) of the liquid crystal lens portion 20, and also serves as a driving electrode for a sensor in the touch sensor portion 30. The driving electrode 19 is formed of, for example, a transparent conductive film of ITO, IZO, or the like, and is partitioned into a plurality of electrodes having a strip shape. In other words, a plurality of slits (portions at which an electrode is not formed) are formed in the driving electrode 19, and an alignment state of a liquid crystal at the time of applying a voltage varies into a predetermined alignment state by these inter-electrode slits, and therefore is capable of functioning as a liquid crystal lens.

Touch Sensor Portion 30

In the touch sensor portion 30, a detection electrode 22 is laminated above the driving electrode 19 so as to form an electrostatic capacitor (capacitative element) between the detection electrode 22 and the driving electrode 19. As described above, the driving electrode 19 also drives the touch sensor portion 30 together with the liquid crystal lens portion 20. The detection electrode 22 is arranged above the driving electrode 19 with a fourth substrate 21 interposed therebetween, and is formed of, for example, a transparent conductive film of ITO, IZO, or the like, and is partitioned into a plurality of electrodes having a strip shape, similarly to the driving electrode 19. These driving electrode 19 and the detection electrode 22 are disposed in such a manner that respective strip-shaped electrode intersect each other (details thereof will be described later).

In addition, the liquid crystal lens portion 20 and the touch sensor portion 30, which use the driving electrode 19 in common, may be manufactured as described below. That is, for example, the detection electrode 22 and the driving electrode 19 are formed on a front surface and a rear surface of the fourth substrate 21, respectively, with a predetermined pattern described later, and the alignment film 17*b* is formed on a surface of the driving electrode 19. On the other hand, for example, a spacer or the like may be provided above the third substrate 15 having the counter electrode 16 and the alignment film 17*a* on a surface thereof, the liquid crystal layer 18 may be dropped, and then a driving electrode 19 side surface of the fourth substrate 21 may be adhered to the third substrate 15 to seal the liquid crystal layer 18. In this embodiment, a laminated body of the liquid crystal lens portion 20 and the touch sensor portion 30, which is manufactured in this manner, may be adhered on the second substrate 13 that sealing the pixel portion 10 with the adhesion layer 14 interposed therebetween.

The fourth substrate 21 is formed by a transparent insulating substrate such as glass similarly to the second substrate 13 and the third substrate 15. Here, the fourth substrate 21 as a dielectric material is interposed between the driving electrode 19 and the detection electrode 22, such that a capacitative element is formed between the driving electrode 19 and the detection electrode 22. A polarization plate 23 may be adhered above the fourth substrate 21. Here, two kinds of polarized light are included in the light emitted from the pixel portion 10. One polarized light of the two kinds of polarized light is affected by a birefringence effect in the liquid crystal lens portion 20, but the other polarized light is emitted without being affected by the effect. Therefore, the polarized light, which is not affected by the birefringence effect in the liquid crystal lens portion 20, is removed by the polarization plate 23.

In this manner, in this embodiment, the liquid crystal lens portion 20 and the touch sensor portion 30 are laminated above the pixel portion 10, and four sheets of substrates in total including the first substrate 11, the second substrate 13, the third substrate 15, and the fourth substrate 21 are used. Here, the first substrate 11 and the second substrate 13 function as a driving substrate and a sealing substrate of the pixel portion 10, respectively, and the third substrate 15 functions as a lower substrate (counter substrate) of the liquid crystal lens portion 20. The fourth substrate 21 functions as a sealing substrate of the liquid crystal lens portion 20 and as a dielectric material in the touch sensor portion 30.

Overall Configuration

Figure 2:
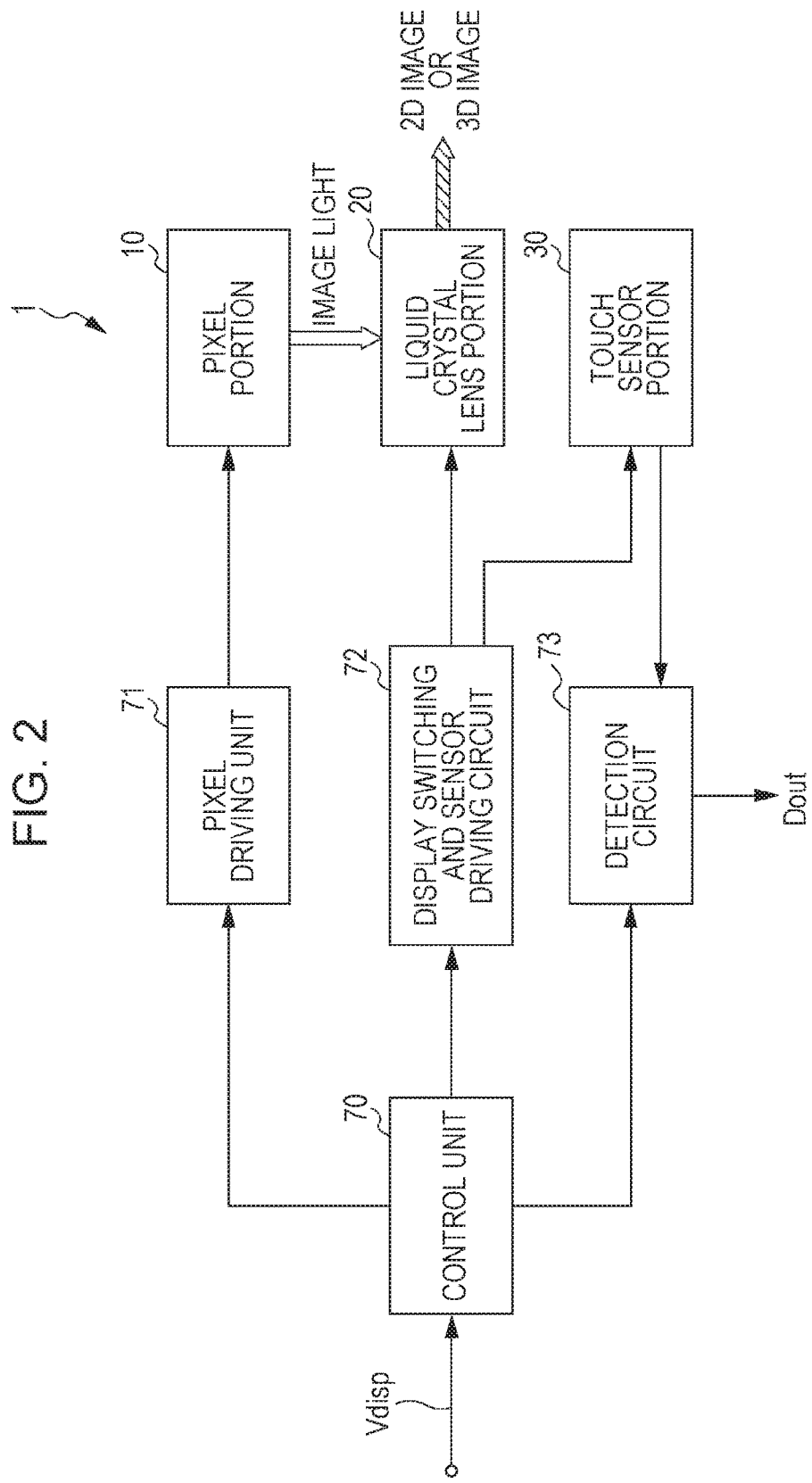
FIG. 2 is a functional block diagram illustrating an overall configuration of the display device shown in FIG. 1.

FIG. 2 shows a functional block diagram schematically illustrating an overall configuration of the display device 1 including the pixel portion 10, the liquid crystal lens portion 20, and the touch sensor portion 30. In this manner, the display device 1 includes a control unit 70, the pixel portion 10, the liquid crystal lens portion 20, and the touch sensor portion 30, and a pixel driving unit 71 to drive these portions, a display switching and sensor driving circuit 72, and a detection circuit 73.

The control unit 70 is a circuit that supplies a control signal with respect to the pixel driving unit 71, the display switching and sensor driving circuit 72, and the detection circuit 73, respectively, based on a video signal Vdisp supplied from an outside, and that controls in such a manner that these operate at a predetermined timing. Specifically, the control unit 70 supplies a video signal S based on the video signal Vdisp with respect to the pixel driving unit 71, and controls the display switching and sensor driving circuit 72 to supply a predetermined driving signal with respect to the liquid crystal lens portion 20.

Pixel Driving Unit 71

The pixel driving unit 71 drives the pixel portion 10 based on the video signal S supplied from the control unit 70. The pixel driving unit 71 includes, for example, a video signal processing circuit that performs a predetermined correction process with respect to the video signal S, a timing generating circuit that controls each timing of a display operation and a sensor operation (all of these are not shown), and various drivers.

Figure 3:
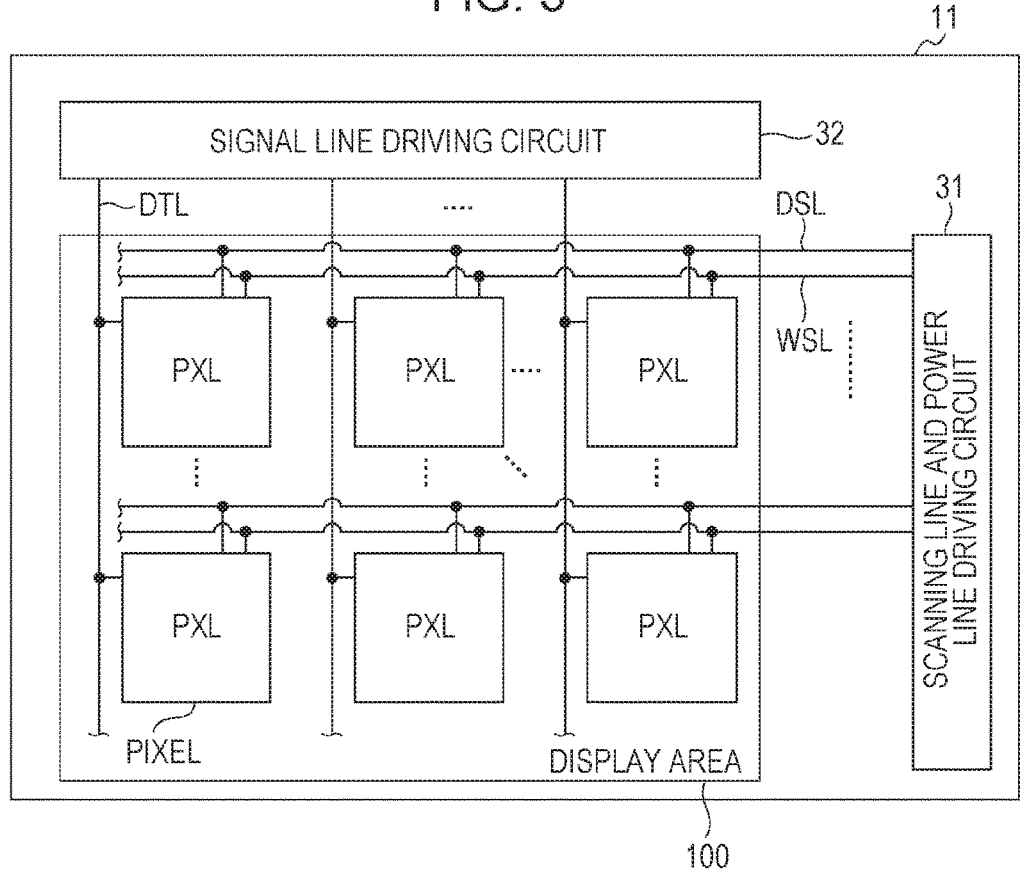
FIG. 3 is a block diagram illustrating an example of peripheral circuits in a pixel driving unit shown in FIG. 2.

FIG. 3 illustrates a configuration example of peripheral circuits (drivers) of the pixel portion 10. In an effective display area 100, a plurality of pixels (PXLs) are two-dimensionally disposed in a matrix state, and a scanning line and power line driving circuit 31, and a signal line driving circuit 32 are arranged at the periphery of the effective display area 100. Each pixel (PXL) is connected to a scanning line WSL, a power line DSL, and a signal line DTL.

The scanning line and power line driving circuit 31 includes a scanning line driving circuit and a power line driving circuit (not shown). The scanning line driving circuit sequentially applies a selection pulse with respect to the plurality of scanning lines WSLs at a predetermined timing to sequentially select each pixel. Specifically, the scanning line driving circuit time-divisionally switches and outputs a voltage Von1 to set a writing transistor Tr1 described later in an on-state, and a voltage Voff1 to set the writing transistor Tr1 in an off-state. The power line driving circuit sequentially applies a control pulse with respect to a plurality of power lines DSLs at a predetermined timing to perform a control of a light-emitting operation and a light-quenching operation of each pixel. Specifically, the power line driving circuit time-divisionally switches and outputs a voltage VH1 that allows a current Ids to flow to a driving transistor Tr2 described later and a voltage VL1 that prevents the current Ids from flowing thereto.

The signal line driving circuit 32 generates an analog video signal corresponding to the video signal S input from the outside at a predetermined timing, and applies it to each signal line DTL. In this manner, the writing of the video signal is performed with respect to a pixel selected by the scanning line driving circuit.

Configuration Example of Pixel Circuit

Figure 4:
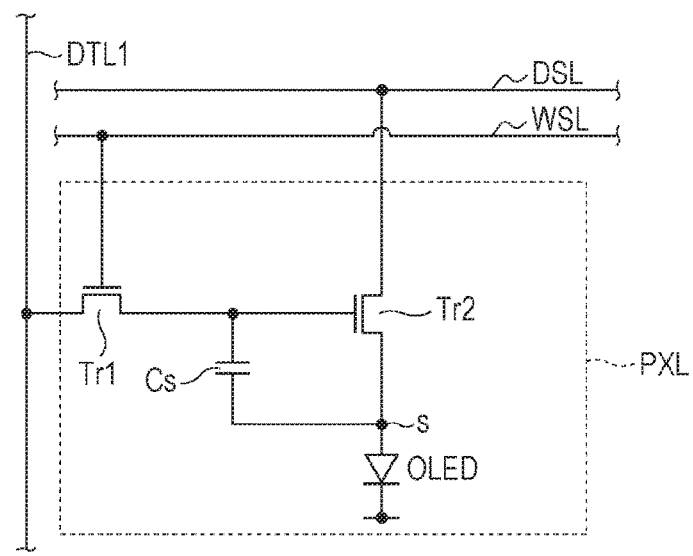
FIG. 4 is a diagram illustrating a circuit configuration of a pixel portion shown in FIG. 1.

FIG. 4 illustrates an example of a circuit configuration of the pixel (PXL). The pixel portion 10 includes an organic EL element (OLED), the writing (for sampling) transistor Tr1, the driving transistor Tr2, a holding capacitative element Cs. The writing transistor Tr1 and the driving transistor Tr2 are, for example, n-channel MOS (Metal Oxide Semiconductor) type TFT, respectively. A kind of the TFT is not particularly limited, and for example, may be a reversely staggered structure (so-called a bottom gate type), or a staggered structure (so-called a top gate type).

In each pixel, a gate of the writing transistor Tr1 is connected to the scanning line WSL, a drain there of is connected to the signal line DTL, and a source thereof is connected to a gate of the driving transistor Tr2 and one end of the holding capacitative element Cs. A drain of the driving transistor Tr2 is connected to the power line DSL, and a source thereof is connected to the other end of the holding capacitative element Cs and an anode of the organic EL element (OLED). A cathode of the organic EL element (OLED) is set to a fixed potential, and is set to a ground (ground potential).

Display Switching and Sensor Driving Circuit 72

The display switching and sensor driving circuit 72 applies a predetermined driving signal to the liquid crystal lens portion 20 and the touch sensor portion 30 based on a control signal supplied from the control unit 70. In this embodiment, as described above, the driving electrode 19 is common to the liquid crystal lens portion 20 and the touch sensor portion 30, but a driving signal (a driving signal Vd described later) for the liquid crystal lens portion 20, and a driving signal (a driving signal Vs described later) for the touch sensor portion 30 are separately set. That is, the display switching and sensor driving circuit 72 applies signals of AC rectangular waveforms different from each other with respect to the driving electrode 19 at timings different from each other.

Figure 5:
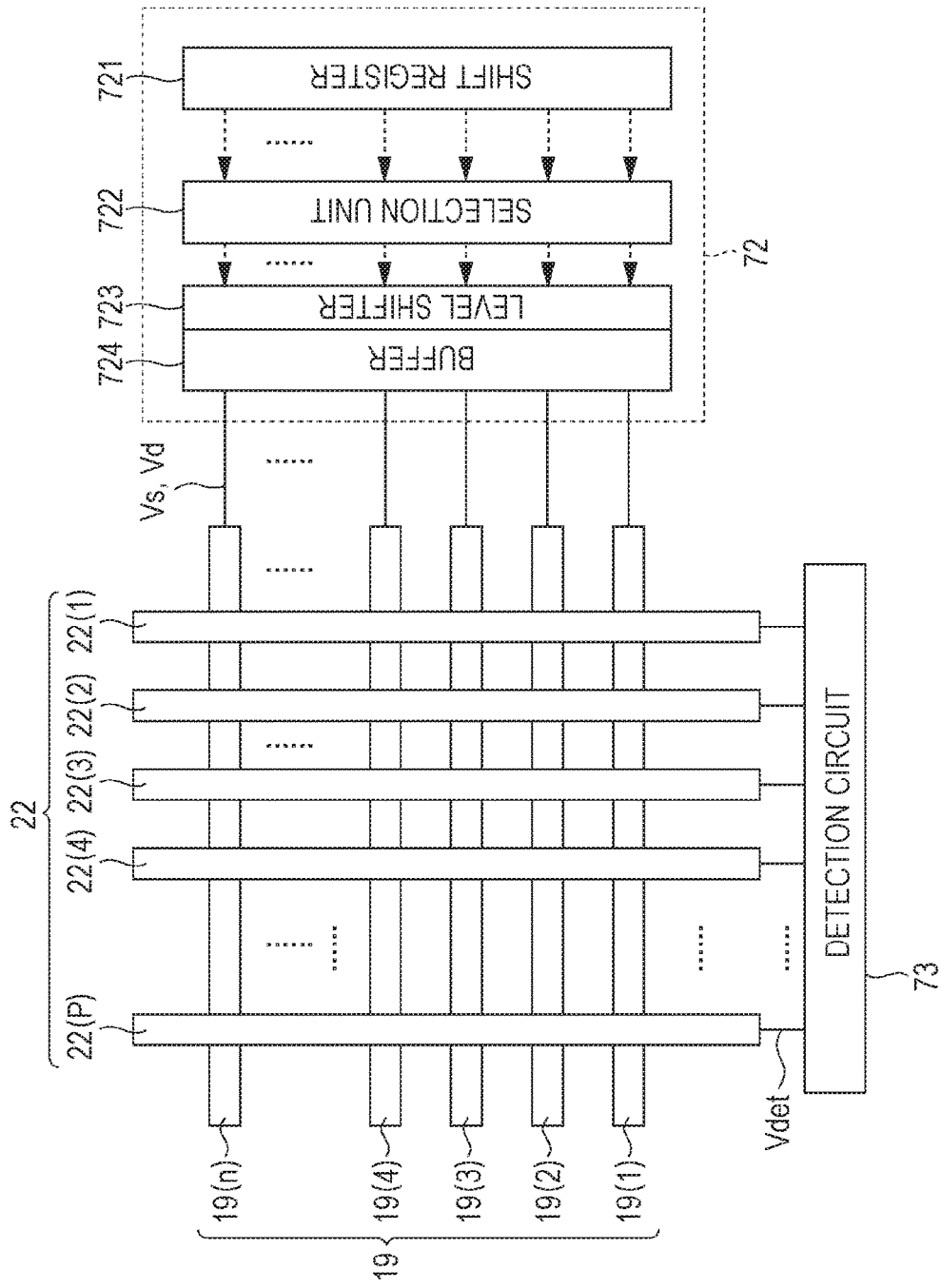
FIG. 5 is a conceptual diagram illustrating an example of a switching and sensor driving circuit and a detection circuit shown in FIG. 2, together with a layout of a driving electrode for a sensor and a detection electrode.

FIG. 5 schematically illustrates an example of the display switching and sensor driving circuit 72 and the detection circuit 73, together with a layout of the driving electrode 19 and the detection electrode 22. In addition, the layout of the layout of the driving electrode 19 and the detection electrode 22 is a layout seen from the detection electrode 22 side.

Example of Electrode Layout

The driving electrode 19 includes, for example, a plurality (n) of stripe-shaped driving electrodes 19(1) to 19(n) that extend in one direction. In these driving electrodes 19(1) to

19(n), m (m is an integer of 2 to n) pieces of driving electrodes 19 may be electrically connected to each other, or all of the n pieces of driving electrodes 19 may be provided to be electrically isolated from each other. In the former case, m pieces of driving electrodes 19 have a shape (a comb-like shape) in which respective end portions thereof are connected to each other, and a driving signal may be applied in a state in which m pieces of connected driving electrode 19 are set as one set (unit driving line).

On the other hand, the detection electrode 22 includes a plurality of (p) strip-shaped detection electrodes 22(1) to 22(p) that extend in a direction intersecting (hereinafter, referred to as "orthogonal to") the plurality of driving electrodes 19(1) to 19(n). In regard to these detection electrodes 22(1) to 22(p), q pieces (q is an integer of 2 to p) of detection electrodes 22 may be electrically connected to each other, or all of the p pieces of detection electrodes 22 may be provided to be electrically isolated from each other. In the former case, q pieces of detection electrodes 22 have a shape (a comb-like shape) in which respective end portions thereof are connected to each other), and a detection signal may be acquired in a state in which q pieces of detection electrodes 22 are set as a unit detection line. In the latter case, a detection signal is acquired for each of the detection electrodes 22.

Due to the layout of the detection electrodes 22 and the driving electrodes 19, a dielectric material layer (here, the fourth substrate 21) is interposed between the detection electrodes 22 and the driving electrodes 19 at each intersecting portion thereof in the vertical direction. That is, at each intersecting portion of the detection electrodes 22 and the driving electrodes 19, a capacitive element is formed therebetween.

In addition, the plurality of detection electrodes 22 and the driving electrodes 19 are provided to intersect each other, such that the intersecting portions are two-dimensionally formed in a matrix state, and are capable of detecting a position of an object with two-dimensional coordinates. Furthermore, detection on whether touch (so-called multi-touch) by plural persons or by plural fingers is present may be realized.

Display Switching and Sensor Driving Circuit 72

The display switching and sensor driving circuit 72 supplies a driving signal Vs with respect to the above-described driving electrodes 19(1) to 19(n), for example, in a line sequential manner (the above-described one or m pieces of driving electrodes 19 are set as a unit driving line). The display switching and sensor driving circuit 72 includes, for example, a shift register 721, a selection unit 722, a level shifter 723, and a buffer 724.

The shift register 721 is a logic circuit that sequentially transmits an input pulse. The selection unit 722 is a logic circuit that controls whether or not the driving signals (Vd and Vs) are to be output with respect to each display pixel 20 within the effective display area 100, and controls the output of the driving signals (Vd and Vs) in response to a position within the effective display area 100, or the like. The level shifter 723 is a circuit that shifts a control signal supplied from the selection unit 722 to a potential level that is sufficient to control the driving signals (Vd and Vs). The buffer 724 is a final output logic circuit to sequentially supply the driving signal Vs to each line, and includes an output buffer circuit, a switch circuit, or the like.

When the driving signal Vs is applied to the driving electrode 19 from the display switching and sensor driving circuit 72, a detection signal (Vdet) based on an electrostatic capacitance may be obtained from the detection electrode 22, such that the obtained detection signal is transmitted to the detection circuit 73.

Detection Circuit 73

Figure 6:
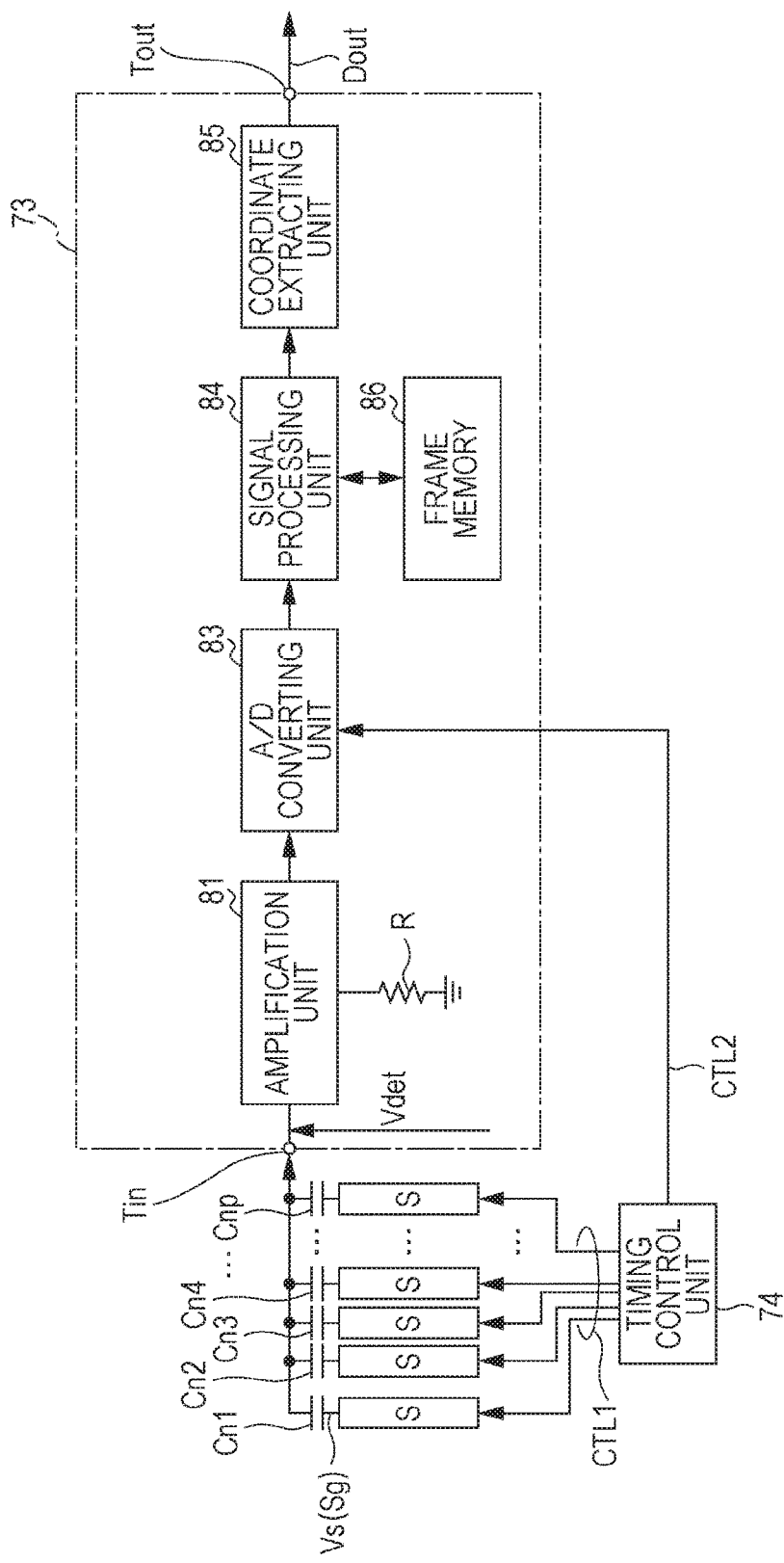
FIG. 6 is a functional block diagram illustrating a configuration example of a detection circuit shown in FIG. 2.

FIG. 6 shows a functional block configuration of the detection circuit 73 that performs an object detection operation and a timing control unit 74 as a timing generator. In addition, capacitative elements Cn1 to Cnp correspond to the electrostatic (electrostatic) capacitative elements that are formed at respective intersecting portions of the driving electrodes 19(1) to 19(n) and the detection electrodes 22(1) to 22(p). Each of the capacitative elements Cn1 to Cnp is connected to a driving signal source S that supplies the driving signal Vs.

The detection circuit 73 (voltage detector DET) includes, for example, an amplification unit 81, an A/D (analog/digital) converting unit 83, a signal processing unit 84, a frame memory 86, a coordinate extracting unit 85, and a resistor R. An input terminal Tin of the detection circuit 73 is connected in common to the other end side (detection electrode 22 side) of each of the capacitative elements Cn1 to Cnp.

The amplification unit 81 amplifies the detection signal Vdet input from the input terminal Tin, and includes an effective amplifier for signal amplification, a capacitor, or the like. The resistor R is disposed between the amplification unit 81 and a ground. The resistor R allows the detection electrode 22 to be a stable state by preventing it from being a floating state. Therefore, in regard to the detection circuit 73, there is an advantage in that it is possible to prevent a signal value of the detection signal Vdet from unstably varying and it is possible to let a static electricity be escaped to a ground through the resistor R.

The A/D converting unit 83 converts the analog detection signal Vdet that is amplified in the amplification unit 81 to a digital detection signal, and includes a comparator (not shown). The comparator compares potentials between the detection signal that is input and a predetermined threshold value voltage Vth. In addition, a sampling timing at the time of A/D converting in the A/D converting unit 83 is controlled by a timing control signal CTL2 that is supplied from the timing control unit 74.

The signal processing unit 84 performs a predetermined process (for example, a signal processing such as a digital noise removing process, and a process of converting frequency information to position information) with respect to the digital detection signal output from the A/D converting unit 83.

The coordinate extracting unit 85 obtains information on whether or not an object is present or a position (coordinates) of the object based on the detection signal output from the signal processing unit 84, and output this from an output terminal Tout as a detection result (detection signal Dout).

In addition, the detection circuit 73 may be formed on the fourth substrate 21, or may be formed at the periphery of the display region on the first substrate 11. However, when the detection circuit 73 is formed on the first substrate 11, integration with a pixel driving driver that is originally formed on the first substrate 11 is obtained, such that it is preferable from the viewpoint of simplicity due to the integration.

Operation Effect of Display Device 1

Pixel Driving Operation

First, a pixel driving operation in the display device 1 will be described with reference to FIGS. 1 to 3. In the display device 1, when the video signal S is input to the pixel driving unit 71 from the control unit 70, the scanning line and power line driving circuit 31 and the signal line driving circuit 32 display-drives each pixel (PXL) in the effective display region 100. In this manner, a driving current flows to the organic EL element (OLED) in each pixel, and in the organic EL layer 12, a hole and an electron are recoupled and thereby white light-emission occurs. Light emitted from the pixel portion 10 is input to the liquid crystal lens portion 20 after being sequentially transmitted through the second substrate 13, the adhesion layer 14, and the third substrate 15.

At this time, in the case of displaying a 3D image, the control unit 70 performs a control in order for the liquid crystal lens portion 20 described later to perform a 3D display operation (specifically, applies a driving signal Vd1 to the driving electrode 19), and a video signal corresponding to an image in which for example, left and right parallax images are combined is supplied with respect to the pixel driving unit 71 as a video signal S. On the other hand, in the case of displaying a 2D image, the control unit 70 performs a control in order for the liquid crystal lens portion 20 described later to perform a 2D display operation (specifically, applies a driving signal Vd2 to the driving electrode 19), and supplies a video signal corresponding to a common 2D image with respect to the pixel driving unit 71 as the video signal S.

Three-Dimensional Image Display Operation and Two-Dimensional Image Display Operation Through the above-described process, light incident to the liquid crystal lens portion 20 is transmitted through the liquid crystal lens portion 20 and is displayed as an image. At this time, in the liquid crystal lens portion 20, a voltage is supplied to the liquid crystal layer 18 through the driving electrode 19 and the counter electrode 16, in response to the driving signal (Vd) applied to the driving electrode 19. In this manner, an alignment state varies in the liquid crystal layer 13, and an image based on the incident light is displayed as a 3D image or a 2D image. Hereinafter, such an image display operation will be described in detail.

Figure 7:
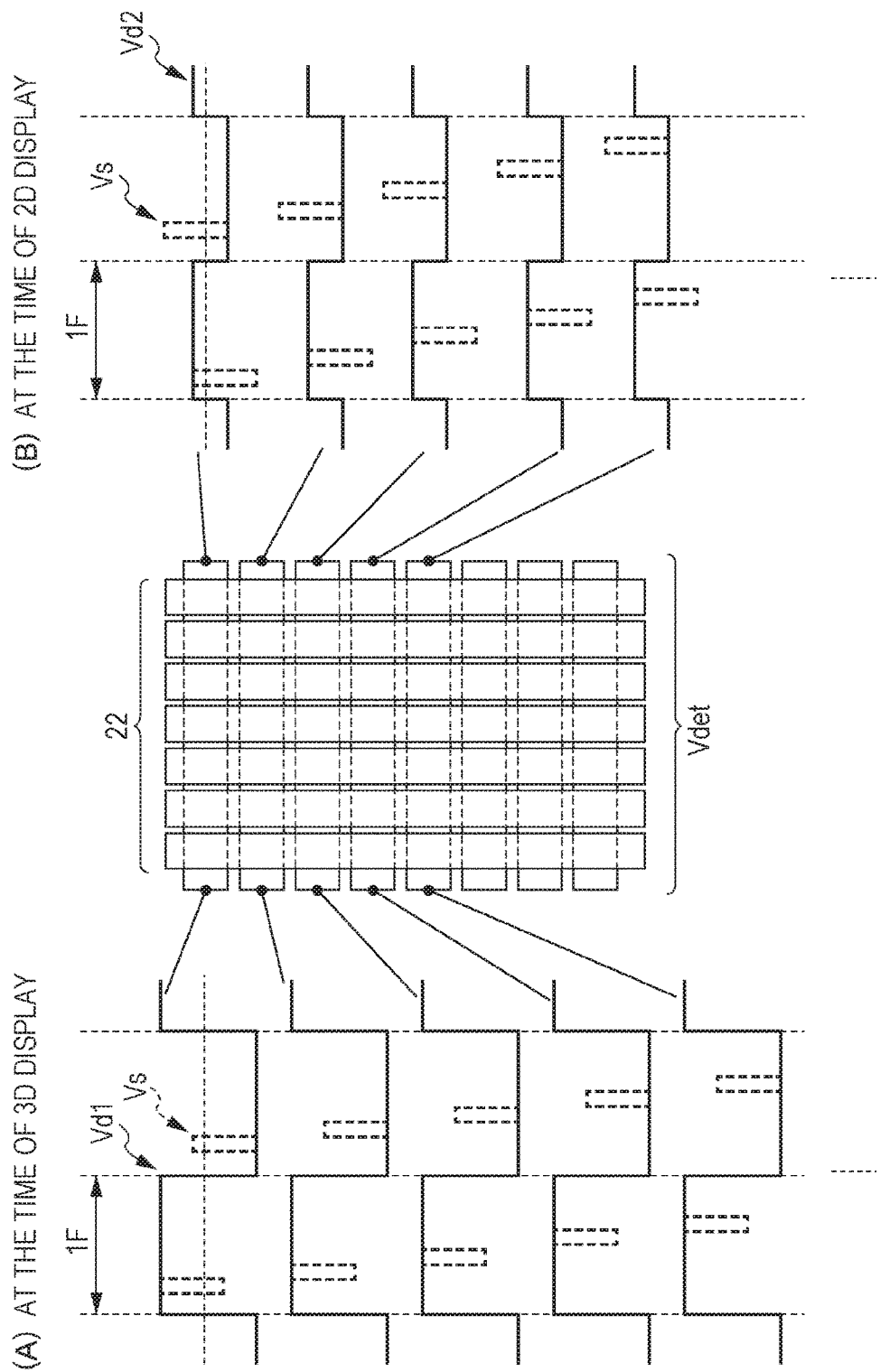
FIG. 7 is conceptual diagram illustrating driving signal waveforms for a 3D display, a 2D display, and a sensor.

FIG. 7 illustrates an AC rectangular waveform in the driving signal for a 3D display and a 2D display, together with a waveform for a sensor. The display switching and sensor driving circuit 72 applies a predetermined driving signal corresponding to the driving electrode 19 based on a control instruction from the control unit 70. Specifically, in the case of performing the 3D image display, as shown in FIG. 7(A), the display switching and sensor driving circuit 72 applies the driving signal Vd1 in which a polarity thereof is inverted in a cycle of one frame period, for example, in the AC rectangular waveform. At this time, the display switching and sensor driving circuit 72 applies the same driving signal Vd1 with respect to all of the plurality of driving electrodes 19(1) to 19(n) making up the driving electrode 19 at the same timing.

On the other hand, in the case of performing the 2D image display, as shown in FIG. 7(B), the display switching and sensor driving circuit 72 applies the driving signal Vd2 in which a polarity thereof is inverted in a cycle of one frame period, for example, in the AC rectangular waveform, and which is different from the driving signal Vd1 (here, Vd1>Vd2). At this time, as is the case of the 3D display, the display switching and sensor driving circuit 72 applies the same driving signal Vd2 with respect to all of the plurality of driving electrodes 19(1) to 19(n) making up the driving electrode 19 at the same timing. In addition, the AC rectangular waveform of these driving signals Vd1 and Vd2, or the magnitude relationship thereof may be appropriately set in correspondence with characteristics of liquid crystal used in the liquid crystal layer 18, the thickness of the liquid crystal layer 18, a scale of an inter-electrode slit in the driving electrode 19, or the like.

FIGS. 8A and 8B illustrate a variation (specifically, a variation in an alignment state of a liquid crystal molecular) in a refraction index of the liquid crystal lens portion 20 in the case of the 3D display and in the case of the 2D display as described above, respectively. As shown in FIG. 8A, when the driving signal Vd1 is applied to the driving electrode 19, light incident from the pixel portion 10 side is refracted during being transmitted through the liquid crystal layer 18 and is emitted in a plurality of angle directions different from each other. In this manner, an image (a combined image of left and right parallax images) based on the light emitted from the pixel portion 10 is projected with being separated to left and right eyes by the liquid crystal lens portion 20 and is displayed (visually recognized) as a 3D image.

On the other hand, as shown in FIG. 8B, in a case where the driving signal Vd2 is applied to the driving electrode 19, the light incident from the pixel portion 10 side is emitted from the liquid crystal lens portion 20 without being refracted in the liquid crystal layer 18. In this manner, an image (2D image) based on the light emitted from the pixel portion 10 is displayed as a 2D image on the polarization plate 23.

Object Detection Operation

Together with this image display operation, in the display device 1, the touch sensor portion 30 operates to detect whether or not an object (a finger, a stylus, or the like) comes into contact with or approaches the polarization plate 23. Specifically, the display switching and sensor driving circuit 72 supplies the driving signal Vs for a sensor together with the driving signal Vd1 (or Vd2) for the above-described 3D display (or 2D display) with respect to the driving electrode 19 (the driving electrodes 19(1) to 19(n)). At this time, the display switching and sensor driving circuit 72 applies the driving signal Vs with respect to the driving electrodes 19(1) to 19(n), for example, in a line-sequential manner. In addition, as shown in FIG. 7, the driving signal Vs is applied within a very short period compared to the application period of the driving signals Vd1 and Vd2. In this manner, the detection of the object is realized practically without having an effect on the image display operation in the liquid crystal lens portion 20 (without making the liquid crystal layer 18 response in a degree of causing an effect in the display). In addition, the driving signal Vs may be applied in a blanking period of the driving signal Vd1 (or Vd2). When the driving signal Vs is applied to the driving electrode 19, the object detection operation is realized as described below.

Figure 9B:
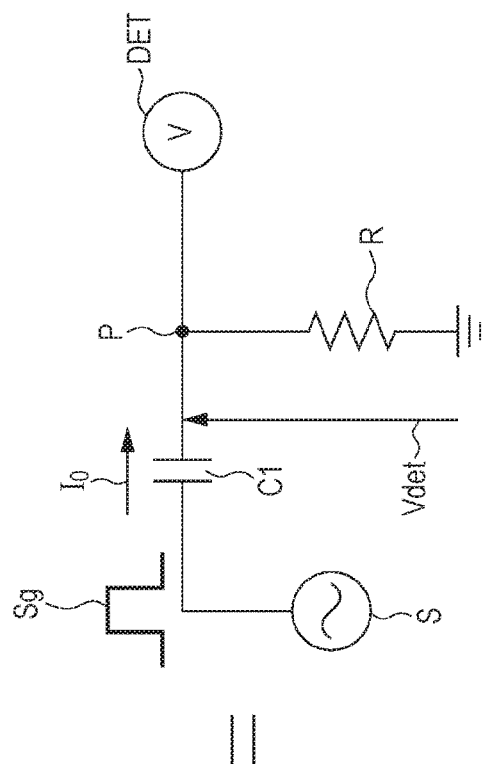
FIGS. 9A and 9B are conceptual diagrams illustrating a principle of an object detecting operation, in which a finger non-contact state is illustrated.
Figure 9A:
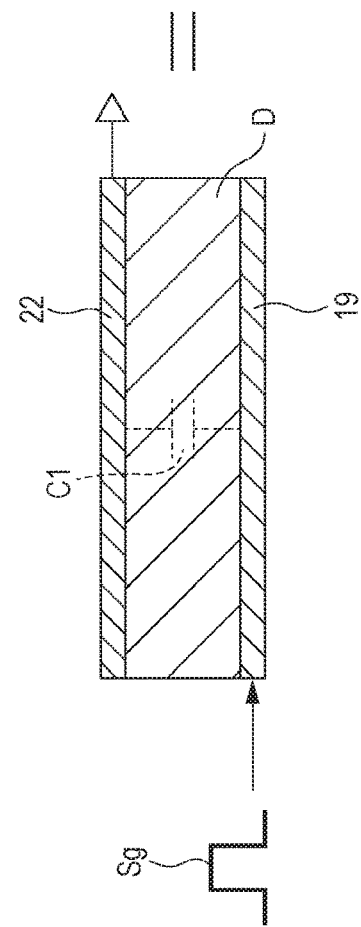

FIGS. 9A to 11B show schematic diagrams illustrating a principle of the object detection operation. As shown in FIG. 9A, a capacitative element C1 is formed by the driving electrode 19 and the detection electrode 22 that are disposed to be opposite to each other with a dielectric material D (corresponding to the fourth substrate 21) disposed therebetween, but this structure is expressed as an equivalent circuit shown in FIG. 9B. In the capacitative element C1, one end thereof is connected to an AC signal source S (a driving signal source), and the other end P is grounded through a resistor R, and is connected to a voltage detector (detection circuit) DET. When an AC rectangular wave Sg (FIG. 11B) with a predetermined frequency (for example, substantially several kHz to several tens kHz) is applied to the driving electrode 19 (one end of the capacitative element C1) from the AC signal source S, an output waveform (a detection signal Vdet) shown in FIG. 11A occurs at the detection electrode 22 (the other end P of the capacitative element C1). In addition, the AC rectangular waveform Sg corresponds to the driving signal Vs in this embodiment.

In a state in which the finger does not come into contact with (or approach), as shown in FIG. 9B, accompanying charging and discharging of the capacitative element C1, a current I0 corresponding to a capacitance value of the capacitative element C1 flows. A potential waveform at the other end P of the capacitative element C1 at this time becomes, for example, like a waveform $V_0$ FIG. 11A, and is detected by the voltage detector DET.

Figure 10A:
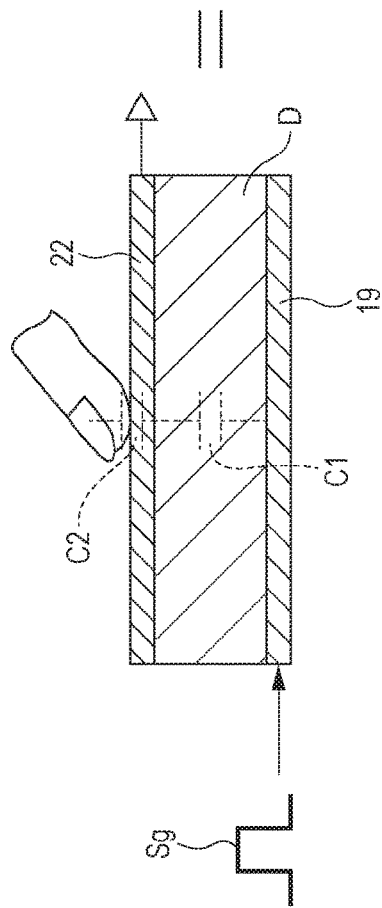
FIGS. 10A and 10B are conceptual diagrams illustrating a principle of an object detecting operation, in which a finger contact state is illustrated.
Figure 10B:
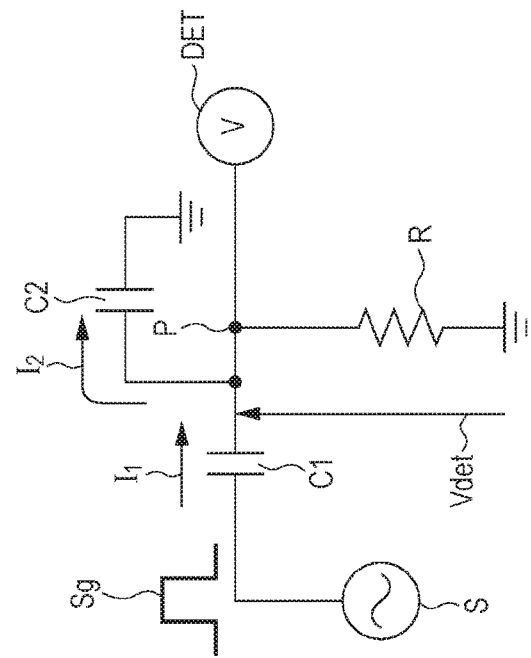
Figure 11A:
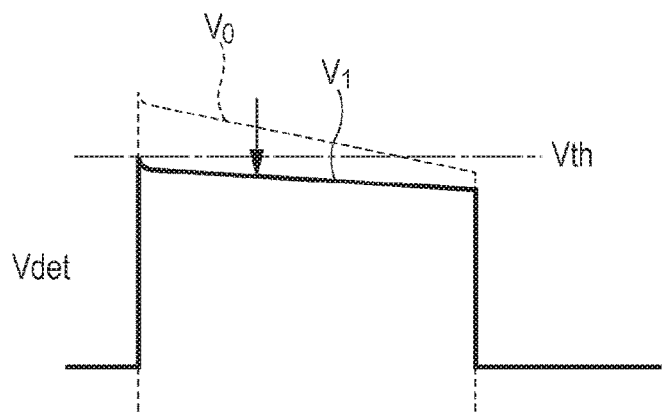
FIGS. 11A and 11B are conceptual diagrams illustrating a principle of an object detecting operation, in which an example of waveforms of a driving signal for a sensor and a detection signal is illustrated.
Figure 11B:

On the other hand, in a state in which the finger comes into contact with (approaches), as shown in FIG. 10B, it becomes an equivalent to a state in which a capacitative element C2, which is formed by an object (for example, a finger), is serially added to the capacitative element C1. At this state, accompanying charging and discharging with respect to the capacitative elements C1 and C2, each of currents $I_1$ and $I_2$ flows. A potential waveform at the other end P of the capacitative element C1 at this time becomes, for example, like a waveform $V_1$ FIG. 11A, and is detected by the voltage detector DET. At this time, a potential at a point P becomes a divided voltage potential determined depending on values of the current $I_1$ and $I_2$ that flow through the capacitative elements C1 and C2. Therefore, the waveform $V_1$ becomes a value smaller than that of the waveform $V_0$ in the non-contact state. The detection of an object that comes into contact with or approaches is realized through a detection of a variance in the waveforms (a variance in a voltage value).

In this embodiment, as described above, at each of the intersecting portions of the n pieces of driving electrodes 19(1) to 19(n) and the p pieces of detection electrodes 22(1) to 22(p), the capacitative element C1 is formed. Here, as shown in FIG. 7, when the driving signal Vs is applied in a line sequential manner with respect to the driving electrodes 19(1) to 19(n), the following operation occurs. That is, charging and discharging is performed with respect to each of Cn1 to Cnp formed at intersecting portions of one driving electrode 19 to which the driving signal Vs is applied at an arbitrary timing, and the plurality of (here, p) detection electrodes 22(1) to 22(p). As a result thereof, the detection signal Vdet having a magnitude corresponding to a capacitance value of the capacitative element C1 is output from each of the detection electrodes 22(1) to 22(p). In addition, accompanying the scanning of the driving signal Vs, a column of the capacitative element C1, which becomes a target to be charged and discharged, is sequentially moved.

In a state in which the scanning of the driving signal Vs is performing, in a case where user's finger or the like is not present at a surface side of the polarization plate 23, the magnitude of the detection signal Vdet becomes substantially constant.

On the other hand, when the user's finger comes into contact with (approaches) the surface of the polarization plate 23, the capacitative element C2 due to the finger is added to the capacitative element C1 that is originally formed at the contact place. As a result thereof, a value of the detection signal Vdet at the point of time when the contact place is scanned (that is, at the point of time when the driving signal Vs is applied to the driving electrode 19 corresponding to the touch place among the driving electrodes 19(1) to 19(n)) becomes smaller than that of other places. In this manner, the detection signal Vdet, which may be obtained through the detection electrode 22, is output to the detection circuit 73.

The detection circuit 73 compares the detection signal Vdet obtained as described above and a predetermined threshold value voltage Vth, and determines as a non-contact state (not-approaching state) when the detection signal Vdet is equal to or larger than the threshold value voltage Vth, and determines as a contact state (approaching state) when the detection signal Vdet is less than the threshold value voltage Vth. In this manner, the object detection operation is performed. In addition, the contact place (position coordinates) of the object may be calculated from an application timing of the driving signal Vs, and a detection timing of the detection signal Vdet that is less than the threshold value voltage Vth.

As described above, in this embodiment, since the above-described liquid crystal lens portion 20 and the touch sensor unit 30 are provided above the pixel portion 10, it is possible to display an image based on light emitted from the pixel portion 10 as a 3D image or a 2D image. In addition, it is possible to detect whether or not an object comes into contact with or approaches while performing the image display. Therefore, information may be input by a user while displaying the 3D image and the 2D image in a switchable manner.

In addition, in regard to the touch sensor unit 30 and the liquid crystal lens portion 20, since the driving electrode 19 is used in common (the driving electrode for a sensor also serves as the driving electrode for display switching), it is preferable for a small thickness compared to a case in which the driving electrode for a sensor is provided separately from the driving electrode for display switching.

Next, modification examples (a first modification example and a second modification example) of the display device according to the first embodiment will be described. Hereinafter, like reference numerals will be given to like parts having substantially the same functions as those of the display device 1 of the first embodiment, and description thereof will be appropriately omitted.

First Modification Example

Figure 12:
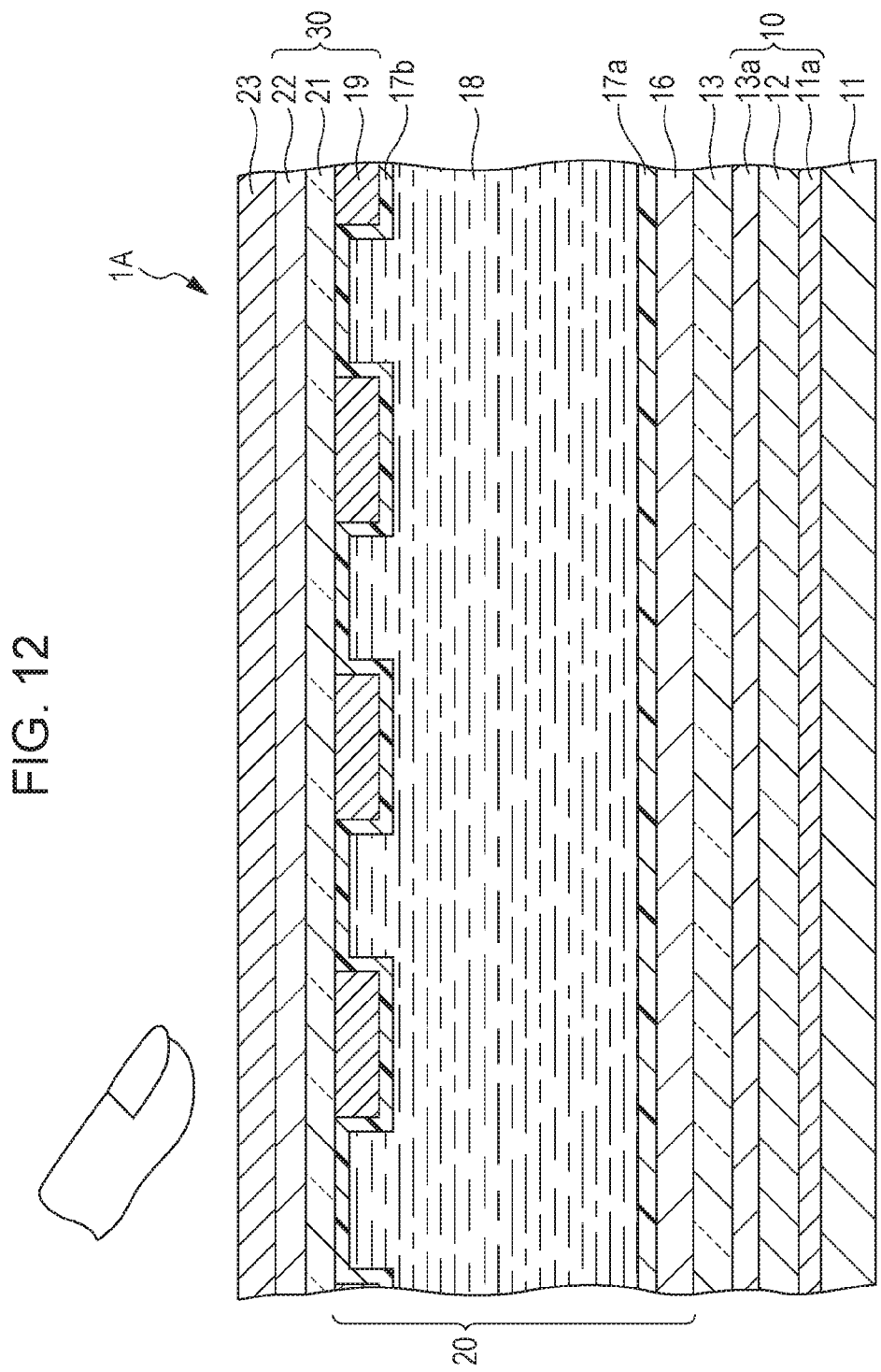
FIG. 12 is a cross-sectional diagram illustrating a schematic structure of a display device according to a first modification example.

FIG. 12 illustrates a cross-sectional structure of a display device (display device 1A) according to a first modification example. The display device 1A is an organic EL display provided with a touch sensor function similarly to the display device 1 according to the first embodiment, and the liquid crystal lens portion 20 as the display switching function portion and the touch sensor portion 30 are provided in this order above the pixel portion 10. In addition, all of the pixel portion 10, the liquid crystal lens portion 20, and the touch sensor portion 30 are made to drive through a pair of electrodes.

However, this modification example has a laminated structure in which the liquid crystal lens portion 20 is formed on the second substrate 13, and specifically, the counter electrode 16 is formed directly on the second substrate 13. That is, in the display device 1 according to the first embodiment, the laminated body in which the liquid crystal lens portion 20 (and the touch sensor unit 30) is sealed between the third substrate 15 and the fourth substrate 21 is provided above the second substrate 13 with the adhesion layer 14 interposed therebetween, but this modification example has a structure in which the third substrate 15 and the adhesion layer 14 are omitted. In this manner, the number of sheets of substrates is totally three sheets including the first substrate 11, the second substrate 13, and the fourth sheet 21.

In addition, in this case, after the counter electrode 16 and the alignment film 17*a* are formed above the second substrate 13 sealing the pixel portion 10, the liquid crystal layer 18 may be dropped on the alignment film 17*a*, and the liquid crystal layer 18 may be sealed with the fourth substrate 21 having the driving electrode 19 as described above in the first embodiment.

In this manner, in a laminated structure in which the liquid crystal lens portion 20 and the touch sensor unit 30 are provided above the pixel portion 10, the second substrate 13 sealing the pixel portion 10 may be used as a lower substrate (in the first embodiment, the third substrate 13) of the liquid crystal lens portion 20. Due to this, the same effect as the first embodiment may be obtained, and the number of parts is reduced and thereby it is easy to realize a relatively small thickness.

Second Modification Example

Figure 13:
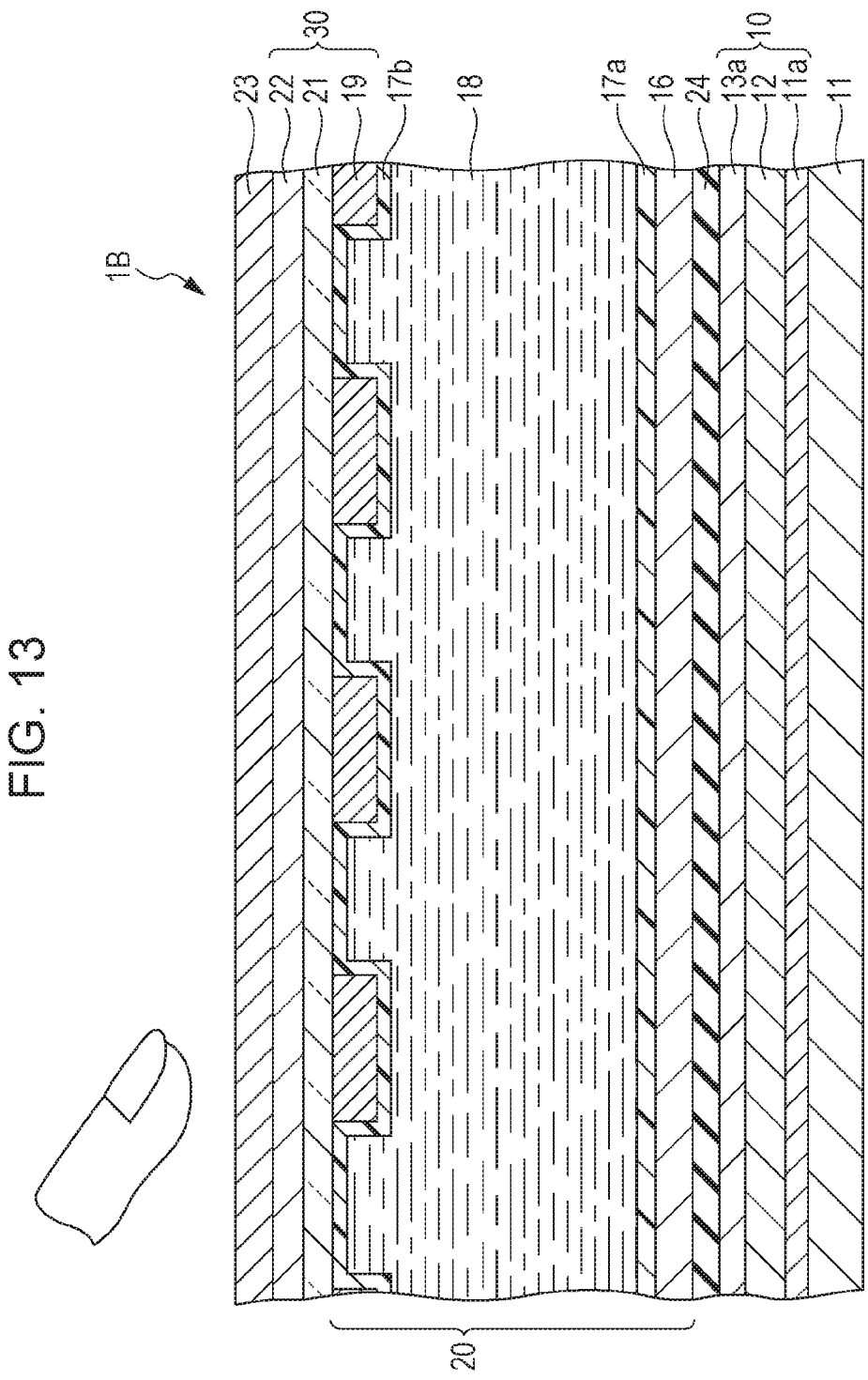
FIG. 13 is a cross-sectional diagram illustrating a schematic structure of a display device according to a second modification example.

FIG. 13 illustrates a cross-sectional structure of a display device (display device 1B) according to a second modification example. The display device 1B an organic EL display provided with a touch sensor function similarly to the display device 1 according to the first embodiment, and the liquid crystal lens portion 20 as the display switching function portion and the touch sensor portion 30 are provided in this order above the pixel portion 10. In addition, all of the pixel portion 10, the liquid crystal lens portion 20, and the touch sensor portion 30 are made to drive through a pair of electrodes. Furthermore, the second modification example has a laminated structure in which the third substrate 15 is omitted similarly to the first modification example.

However, this modification example has a laminated structure in which the second substrate 13 is also omitted in addition to the third substrate 15 and the number of sheets of substrates is totally two sheets including the first substrate 11 and the fourth substrate 21. Specifically, a protective layer 24 is formed on the pixel portion 10, and the counter electrode 16 is formed directly on the protective layer 24. The protective layer 24 is formed of, for example, a silicon nitride film, a silicon oxide film, or the like, and seals and protects the pixel portion 10.

In this manner, in regard to the laminated structure in which the liquid crystal lens portion 20 and the touch sensor unit 30 are provided above the pixel portion 10, the second substrate 13 sealing the pixel portion 10 may be omitted, and in this case, the protective layer 24 may be provided to protect the pixel portion 10. Due to this, substantially the same effect as the first embodiment may be obtained, and the number of sheets of substrates may be reduced.

Second Embodiment

Next, a display device (a display device 2) according to a second embodiment of the present disclosure will be described. Like reference numerals will be given to like parts having substantially the same functions as those of the display device 1 of the first embodiment, and description thereof will be appropriately omitted.

Figure 14:
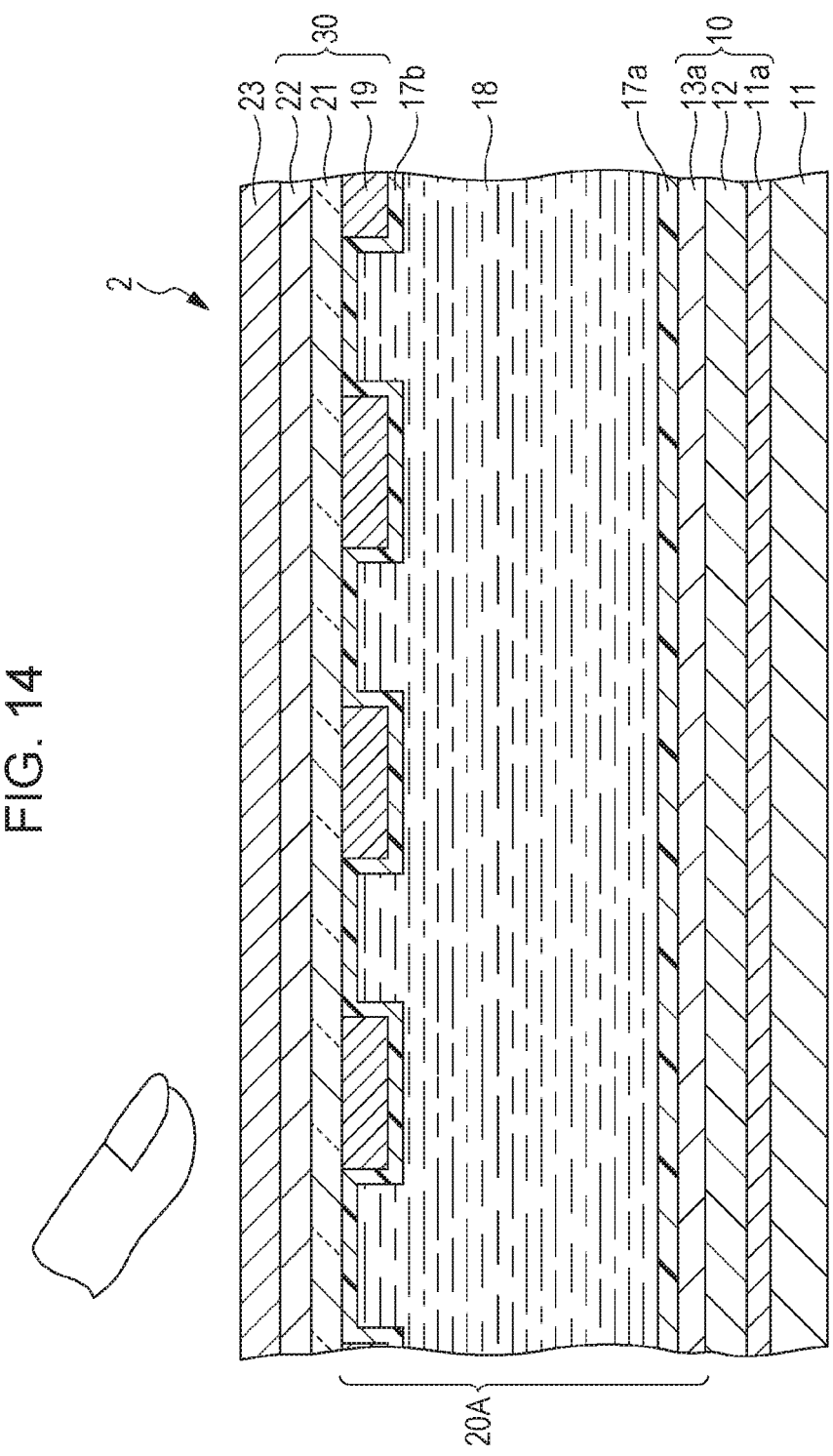
FIG. 14 is a cross-sectional diagram illustrating a schematic structure of a display device according to a second embodiment of the present disclosure.

FIG. 14 illustrates a cross-sectional structure of the display device 2. The display device 2 is an organic EL display provided with a touch sensor function similarly to the display device 1 according to the first embodiment, and the liquid crystal lens portion (liquid crystal lens portion 20A) as the display switching function portion and the touch sensor portion 30 are provided in this order above the pixel portion 10. In addition, all of the pixel portion 10, the liquid crystal lens portion 20A, and the touch sensor portion 30 are made to drive through a pair of electrodes. In addition, a circuit configuration of the pixel portion 10 and configurations of peripheral circuits (the scanning line and power line driving circuit 31 and the signal line driving circuit 32) thereof, the control unit 70, the display switching and sensor driving circuit 72, and the detection circuit 73 are substantially same as the first embodiment.

However, in this embodiment, the common electrode 13*a* in the pixel portion 10 also serves as a counter electrode (corresponds to the counter electrode 16 in the first embodiment) in the liquid crystal lens portion 20A. In other words, one electrode, which is maintained to a fixed potential (or grounded), is used in common in the pixel portion 10 and the liquid crystal lens portion 20A.

Specifically, in the liquid crystal lens portion 20A, the alignment film 17*a* is formed on a common electrode 13*a*, and the liquid crystal layer 18 is provided on this alignment film 17*a*. In this manner, the second substrate 13 and the third substrate 15 become unnecessary, and therefore the number of sheets of substrates becomes totally two sheets in the display device. Similarly to the first embodiment, the liquid crystal layer 18 is sealed by the fourth substrate 21 on which the driving electrode 19 is arranged. Similarly to the liquid crystal lens portion 20 of the first embodiment, the liquid crystal lens portion 20A is a variable-focal length lens that allows a focal length to vary in response to a driving voltage. The liquid crystal lens portion 20A performs an image display based on light emitted from the pixel portion 10, and has a function of displaying an image at that point of time as a 3D image or a 2D image.

In this embodiment, similarly to the first embodiment, the liquid crystal lens portion 20A and the touch sensor unit 30 are provided above the pixel portion 10, and it is possible to display the image based on the light emitted from the pixel portion 10 as the 3D image or the 2D image. In addition, it is possible to detect whether or not an object comes into contact with or approaches while displaying the image. Therefore, it is possible to obtain substantially the same effect as the first embodiment. In addition, the driving electrode 19 is used in common in the liquid crystal lens portion 20A and the touch sensor unit 30, and the common electrode 13*a* is used in common in the pixel portion 10 and the liquid crystal lens portion 20A, such that it is possible to reduce the number of substrates, the number of electrode layers and interconnections. As a result, it becomes easy to realize a simple configuration with a small thickness.

In addition, in the second embodiment, description has been made with respect to a case where the driving electrode 19 and the common electrode 13*a* are used in common, respectively, but it may be configured in such a manner that driving electrodes are separately provided in the liquid crystal lens portion 20A and the touch sensor unit 30, and only the common electrode 13*a* is used in common in the pixel portion 10 and the liquid crystal lens portion 20A.

Third Embodiment

Next, a display device (a display device 3) according to a third embodiment of the present disclosure will be described. Like reference numerals will be given to like parts having substantially the same functions as those of the display device 1 of the first embodiment, and description thereof will be appropriately omitted.

FIG. 15 illustrates a cross-sectional structure of the display device 3. The display device 3 is an organic EL display provided with a touch sensor function similarly to the display device 1 according to the first embodiment, the display switching function portion that is capable of switching the 3D display and the 2D display and the touch sensor portion 30 are provided in this order above the pixel portion 10. All of the pixel portion 10, the display switching function portion, and the touch sensor portion 30 are made to drive through a pair of electrodes. Furthermore, the driving electrode 19 is used in common in the display switching function portion and the touch sensor portion 30. In addition, a circuit configuration of the pixel portion 10 and configurations of peripheral circuits (the scanning line and power line driving circuit 31 and the signal line driving circuit 32) thereof, the control unit 70, the display switching and sensor driving circuit 72, and the detection circuit 73 are substantially the same as the first embodiment.

However, in this embodiment, a liquid lens portion (liquid lens portion 20B) as the display switching function portion is provided. Configurations other than the liquid lens portion 20B are the same as those of the first embodiment.

Similarly to the liquid crystal lens portion 20 according to the first embodiment, the liquid lens portion 20B is a variable-focal length lens that allows a focal length to vary in response to a driving voltage. The liquid lens portion 20B performs an image display based on light emitted from the pixel portion 10, and has a function of displaying an image at that point of time as a 3D image or a 2D image. However, in the liquid lens portion 20B, two liquid layers in which polarity is different in each case (a polar liquid layer 25A and a nonpolar liquid layer 25B) are provided between the driving electrode 19 having electrode slits (divided into a plurality strip-shaped patterns) and the counter electrode 16. In addition, a surface of the driving electrode 19 is covered with an insulating film 26, and an area on the insulating film 26 is partitioned by, for example, partitions 26a in which a surface shape along a substrate surface is a lattice shape or a strip shape. In each area partitioned by the partitions 26a, the nonpolar liquid layer 25B is maintained, and the polar liquid layer 25A is present over a counter electrode 16 side entire surface of the nonpolar liquid layer 25B.

In this embodiment in which the liquid lens portion 20B is provided, similarly to the first embodiment, when a predetermined driving signal is supplied to the driving electrode 19, a predetermined voltage is applied between the driving electrode 19 and the counter electrode 16, and in the liquid lens portion 20B, it is also possible to display an image based on light emitted from the pixel portion 10 in a switchable manner as the 2D image or the 3D image.

FIGS. 16A and 16B schematically illustrate a display operation, or optical paths changed by the liquid lens portion 20B at the time of the 3D display and the 2D display. As shown in FIG. 16A, when a voltage corresponding to the driving signal Vd3 for the 3D display is applied between the driving electrode 19 and the counter electrode 16, in the liquid lens portion 20B, an interface (interface S1) of the polar liquid layer 25A and the nonpolar liquid layer 25B becomes a concave shape. Therefore, light incident from the pixel portion 10 side is refracted on the interface S1 and is emitted from the liquid lens portion 20B. Therefore, similarly to the case of the liquid crystal lens portion 20 according to the first embodiment, an image (a combined image of left and right parallax images) based on the light emitted from the pixel portion 10 is projected with being separated to left and right eyes, and is displayed (visually recognized) as a 3D image.

On the other hand, as shown in FIG. 16B, in a case where a voltage corresponding to a driving signal Vd4 (for example, Vd3>>Vd4) for a 2D display is applied between the driving electrode 19 and the counter electrode 16, an interface (interface S2) between the polar liquid layer 25A and the nonpolar liquid layer 25B becomes a substantially plane shape. Therefore, light incident from the pixel portion 10 side is emitted from the liquid lens portion 20B without being refracted on the interface S2. As a result, an image (a 2D image) based on the light emitted from the pixel portion 10 is displayed on the planarization plate 23 as the 2D image.

In this embodiment in which the display switching operation is performed by using the liquid lens portion 20B, similarly to the first embodiment, the image based on the light emitted from the pixel portion 10 may be displayed as the 3D image or the 2D image. In addition, since touch sensor portion 30 is provided, it is possible to detect whether or not an object comes into contact with or approaches while performing the image display. Therefore, it is possible to obtain substantially the same effect as the first embodiment.

Next, modification examples (a third modification example and a fourth modification example) of the display device according to the third embodiment will be described. Hereinafter, like reference numerals will be given to like parts having substantially the same functions as those of the display device 3 of the third embodiment, and description thereof will be appropriately omitted.

Third Modification Example

Figure 17:
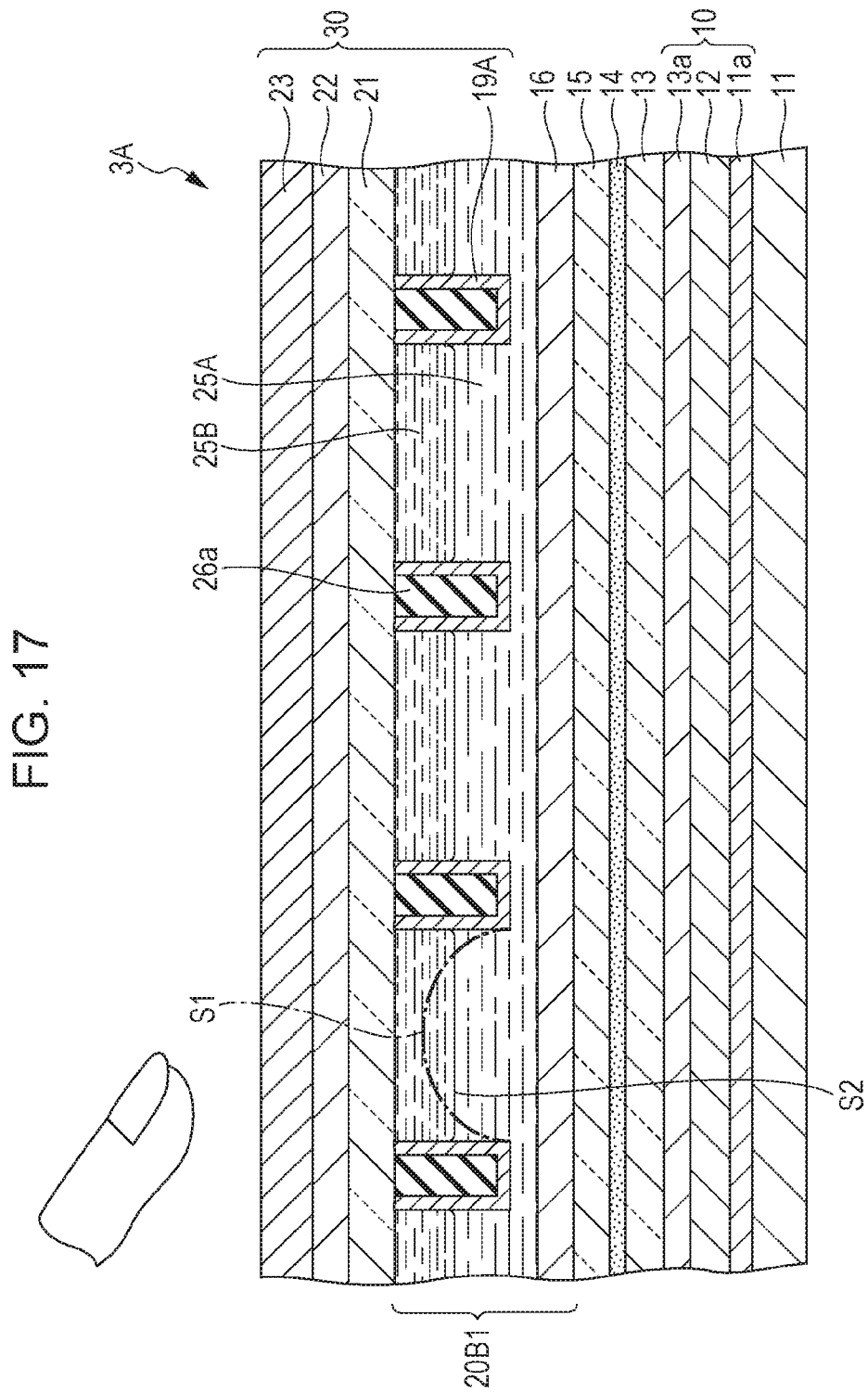
FIG. 17 is a cross-sectional diagram illustrating a schematic structure of a display device according to a third modification example.

FIG. 17 illustrates a cross-sectional structure of a display device (a display device 3A) according to the third modification example. The display device 3A is an organic EL display provided with a touch sensor function similarly to the display device 3 according to the third embodiment, a liquid lens portion 20B1 as a display switching function portion and the touch sensor portion 30 are provided in this order above the pixel portion 10. All of the pixel portion 10, the liquid lens portion 20B1, and the touch sensor portion 30 are made to drive through a pair of electrodes. Furthermore, a driving electrode 19A is used in common in the liquid lens portion 20B1 and the touch sensor portion 30. In the liquid lens portion 20B1, similarly to the third embodiment, the polar liquid layer 25A and the nonpolar liquid layer 25B are maintained between a pair of electrodes to allow a refraction index to vary by a voltage supply.

However, in this modification example, differently from the third embodiment, the driving electrode 19A, which is provided in a strip-shaped pattern at one surface side of the fourth substrate 21, is formed to cover a surface of each partition 26a, and is formed with a strip-shaped pattern in overall. The nonpolar liquid layer 25B is maintained on the fourth substrate 21 in each area partitioned by the driving electrode 19A and the partition 26a.

In this modification example, similarly to the third embodiment, when a voltage corresponding to a driving signal for the 3D display is applied between the driving electrode 19A and the counter electrode 16, a shape of an interface between the polar liquid layer 25A and the nonpolar liquid layer 25B varies (an interface S1; indicated by one dotted-line in FIG. 17), and thereby image light that is incident thereto is refracted and the 3D image display is performed. On the other hand, when a voltage corresponding to a driving signal for the 2D display is applied, at an interface (interface S2; indicated by a solid line in FIG. 17) between the polar liquid layer 25A and the nonpolar liquid layer 25B, the incident image light is transmitted through the interface S2 without being refracted, and thereby the 2D display is performed. As a result, in the configuration like this modification example, it is also possible to substantially the same effect as the third embodiment.

In addition, in the third modification example, description has been made with respect to a case in which the driving electrode 19A is formed to cover the surface of the partition 26a as an example, but the partition 26a may not be provided, and an area may be partitioned by patterning the driving electrode 19 (by adjusting a height and a pitch of the driving electrode 19) so as to maintain the nonpolar liquid layer 25B in each partitioned area.

Fourth Modification Example

Figure 18:
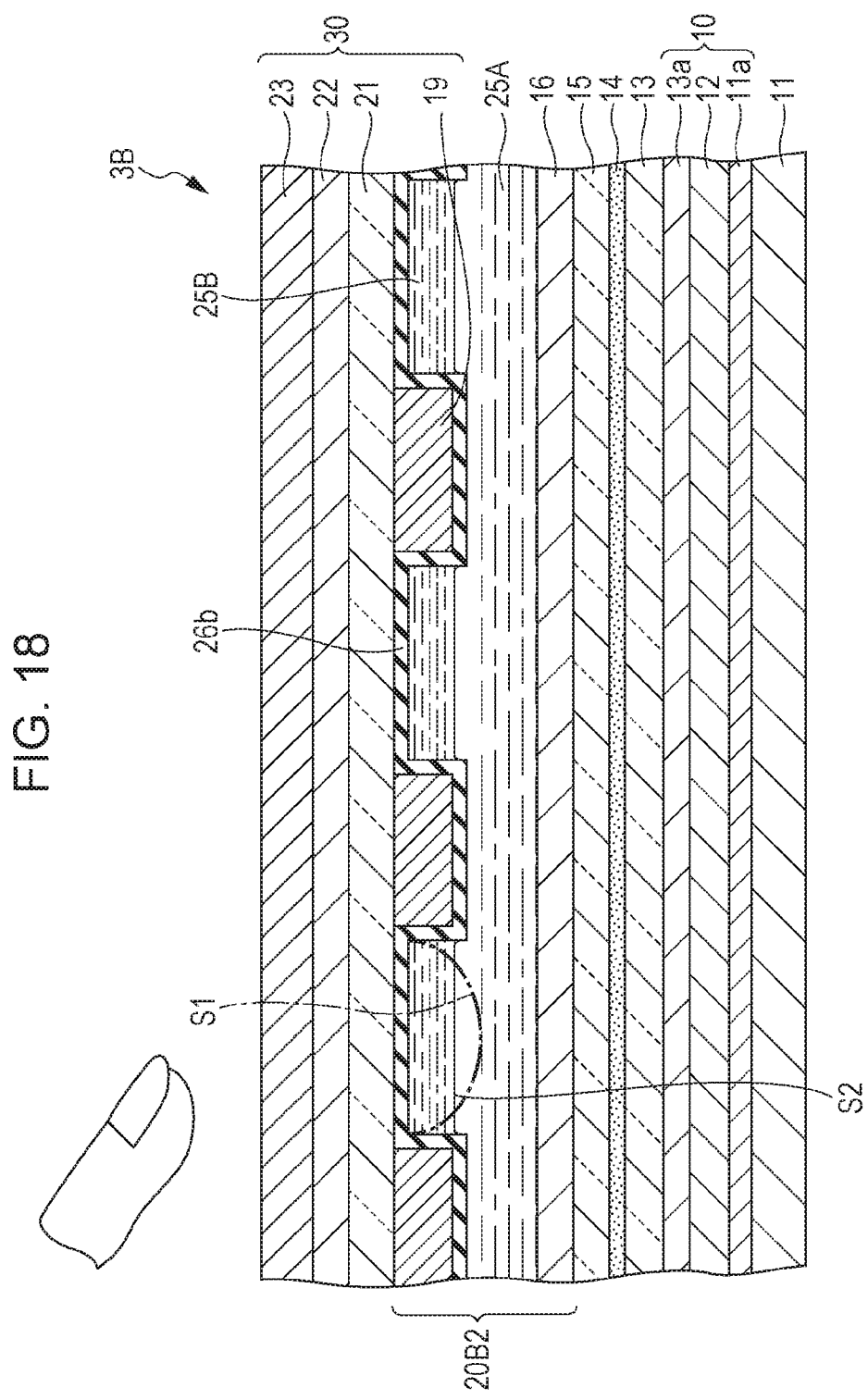
FIG. 18 is a cross-sectional diagram illustrating a schematic structure of a display device according to a fourth modification example.

FIG. 18 illustrates a cross-sectional structure of a display device (a display device 3B) according to the fourth modification example. A configuration of the display device 3B is not limited to the configurations of the display devices 3 and 3A according to the third embodiment and the third modification example.

Similarly to the third embodiment 3 and the third modification example, the display device 3B uses a liquid lens portion 20B2 as a display switching function portion, which includes the polar liquid layer 25A and the nonpolar liquid layer 25B between the driving electrode 19 and the counter electrode 16. However, in the display device 3B, differently from the third embodiment, the driving electrode 19 partitions an area maintaining the nonpolar liquid layer 26b, and a surface of the driving electrode 19 is covered with an insulating film 26b. In other words, the nonpolar liquid layer 25B is provided at each area partitioned by the driving electrode 19 with the insulating film 26b interposed between the driving electrode 19 and the nonpolar liquid layer 25B.

In this modification example, similarly to the third embodiment, when a voltage corresponding to a driving signal for the 3D display is applied between the driving electrode 19 and the counter electrode 16, a shape of an interface between the polar liquid layer 25A and the nonpolar liquid layer 25B varies (an interface S1; indicated by an one-dotted line in FIG. 18), and thereby image light that is incident thereto is refracted and the 3D image display is performed. On the other hand, when a voltage corresponding to a driving signal for the 2D display is applied, at an interface (interface S2; indicated by a solid line in FIG. 18) between the polar liquid layer 25A and the nonpolar liquid layer 25B, the incident image light is transmitted through the interface S2 without being refracted, and thereby the 2D display is performed. As a result, it is also possible to substantially the same effect as the third embodiment.

In addition, in all of the third embodiment, and the third and fourth modification examples, description has been made with respect to a structure in which the polarization plate 23 is provided at the outermost surface as an example, but the polarization plate 23 is provided for the purpose of suppressing reflection of external light. Therefore, it is not necessarily to provide the polarization plate 23 in the third embodiment and the third and fourth modification examples.

Fourth Embodiment

Next, a display device (a display device 4) according to a fourth embodiment of the present disclosure will be described. Like reference numerals will be given to like parts having substantially the same functions as those of the display device 1 of the first embodiment, and description thereof will be appropriately omitted.

Figure 19:
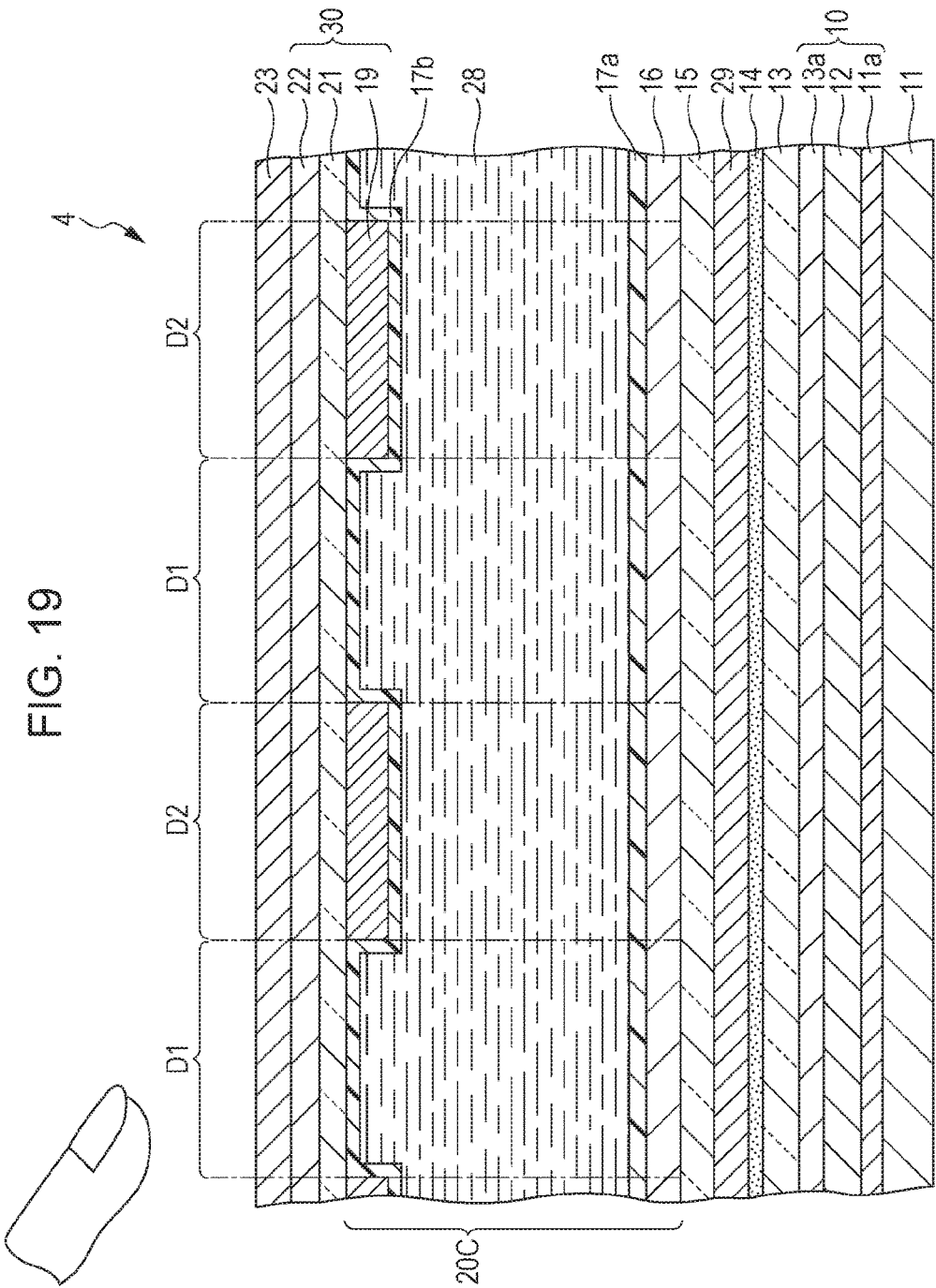
FIG. 19 is a cross-sectional diagram illustrating a schematic structure of a display device according to a fourth embodiment of the present disclosure.

FIG. 19 illustrates a cross-sectional structure of the display device 4. The display device 4 is an organic EL display provided with a touch sensor function similarly to the display device 1 according to the first embodiment, the display switching function portion that is capable of switching the 3D display and the 2D display and the touch sensor portion 30 are provided in this order above the pixel portion 10. All of the pixel portion 10, the display switching function portion, and the touch sensor portion 30 are made to drive through a pair of electrodes. Furthermore, the driving electrode 19 is used in common in the display switching function portion and the touch sensor portion 30. In addition, a circuit configuration of the pixel portion 10 and configurations of peripheral circuits (the scanning line and power line driving circuit 31 and the signal line driving circuit 32) thereof, the control unit 70, the display switching and sensor driving circuit 72, and the detection circuit 73 are substantially the same as the first embodiment.

However, in this embodiment, a barrier parallax (liquid crystal barrier portion 20C) using a liquid crystal as the display switching function portion is provided. Configurations other than the liquid crystal barrier portion 20C are the same as those of the first embodiment.

The liquid crystal barrier portion 20C performs an image display based on light emitted from the pixel portion 10 by shielding a selective area (changes an emission area of a light beam) in response to a driving voltage, and has a function of displaying an image at that point of time as a 3D image or a 2D image. In addition, the liquid crystal barrier 20C has a configuration in which a liquid crystal layer 28 is sealed between the driving electrode 19 and the counter electrode 16.

However, in the liquid crystal barrier portion 20C, in regard to the driving electrode 19 divided in a strip-shaped pattern, an area (a transmission area D1) corresponding an inter-electrode area transmits light at all times, on the other hand, a transmission ratio (transmission state or interception state) may vary in each area (opening and closing area D2) opposite to an electrode portion. In addition, a polarization plate 29, which allows selective polarized light to be incident to the liquid crystal layer 28 is provided to between the third substrate 15 and the adhesion layer 14.

In this embodiment including the liquid crystal barrier portion 20C, similarly to the first embodiment, when a predetermined driving signal is supplied to the driving electrode 19, it is also possible for the liquid crystal barrier portion 20C to display an image based on light emitted from the pixel portion 10 in a switchable manner as the 2D image or the 3D image.

Figure 20A:
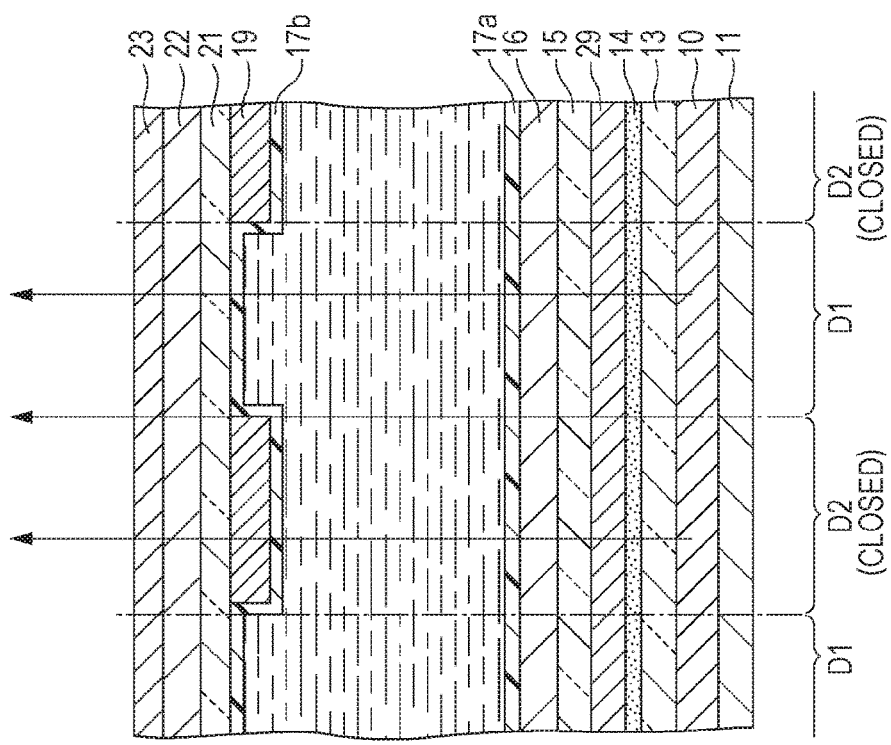
FIGS. 20A and 20B are schematic diagrams illustrating a display operation in a liquid crystal barrier portion at the time of a 3D display and a 2D display.
Figure 20B:
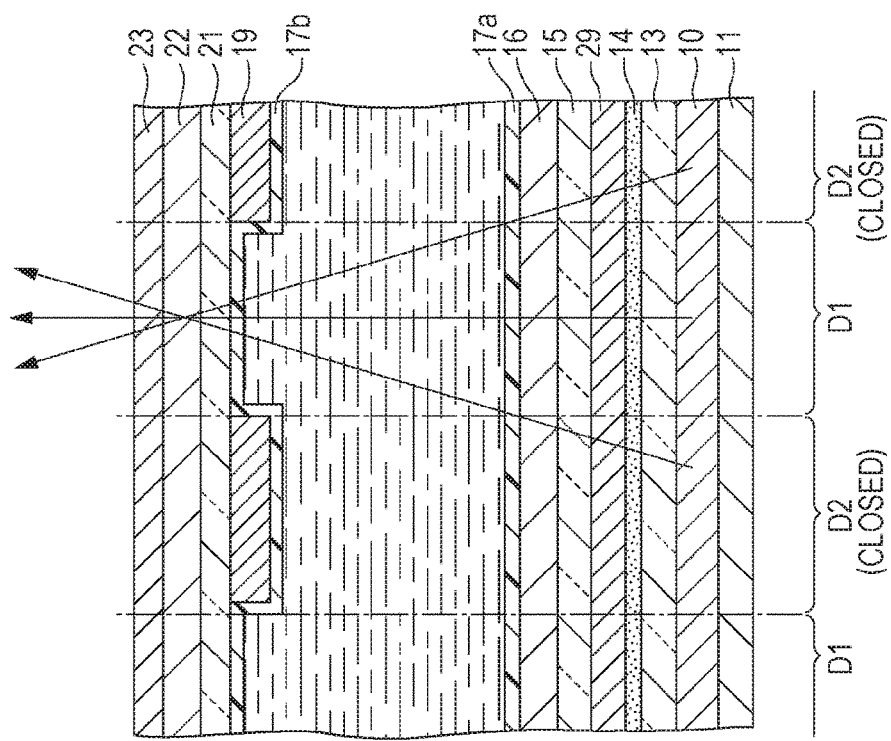

FIGS. 20A and 20B schematically illustrate a display operation in the liquid crystal barrier portion 20C at the time of a 3D display and a 2D display. As shown in FIG. 20A, when the opening and closing area D2 is made to be a closed state (interception state) by applying a predetermined driving signal to the driving electrode 19, in the liquid crystal barrier portion 20C, an emission direction of light emitted from the pixel portion 10 is restricted by the transmission area D1. Therefore, similarly to the case of the liquid crystal lens portion 20 according to the first embodiment, an image (a combined image of left and right parallax images) based on the light emitted from the pixel portion 10 is projected with being separated to left and right eyes, and is displayed (visually recognized) as a 3D image.

On the other hand, as shown in FIG. 20B, when the opening and closing area D2 is made to be an opened state (transmission state) by applying a predetermined driving signal to the driving electrode 19, light incident from the pixel portion 10 side is emitted from the liquid crystal barrier portion 20C while an emission direction is not restricted. Therefore, an image (2D image) based on light emitted form the pixel portion 10 is displayed on the polarization plate 23 as the 2D image.

In this embodiment in which the display switching operation is performed using the liquid crystal barrier 20C, similarly to the first embodiment, an image based on light emitted from the pixel portion 10 may be displayed as the 3D image or the 2D image. In addition, the touch sensor unit 30 is provided, such that it is possible to detect whether an object comes into contact with or approaches while performing such image display. Therefore, it is possible to substantially the same effect as the first embodiment.

In addition, similarly to the first modification example, the third and fourth embodiments may have a laminated structure in which the third substrate 15 is omitted, or similarly to the second modification example, the counter electrode 16 may be provided above the common electrode 13a with the protective layer 24 interposed therebetween. In addition, similarly to the second embodiment, the common electrode 13a also serves as the counter electrode 16 and the third substrate 15 and the second substrate 13 may be omitted.

In addition, in all of the above-described first to fourth embodiment, and the first to fourth modification examples, description has been made with respect to a case in which in the touch sensor portion 30 and the display switching function portion (the liquid crystal lens portion, the liquid lens portion, and the liquid crystal barrier portion), the driving electrode 19 is used in common as an example, but a structure in which a driving electrode for a sensor is separately provided (so-called on-cell structure illustrating fifth and sixth modification example described later) may be possible.

Fifth Modification Example

Figure 21:
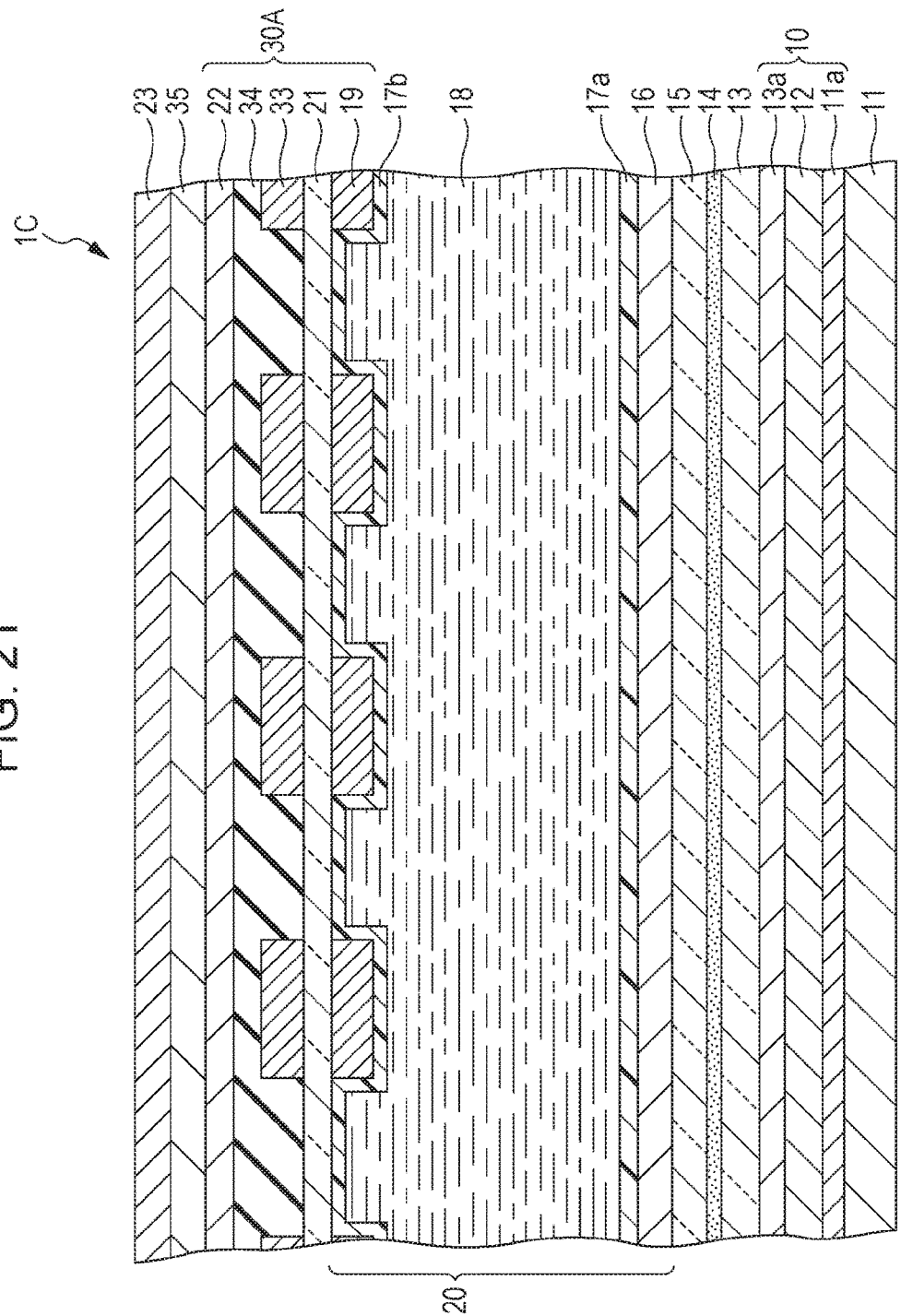
FIG. 21 is a cross-sectional diagram illustrating a schematic structure of a display device according to a fifth modification example.

FIG. 21 illustrates a cross-sectional structure of a display device (a display device 1C) according to a fifth modification example. In the display device 1C, a driving electrode 33 for a sensor is provided on the fourth substrate 21 separately from the driving electrode 19 in a touch sensor portion 30A. That is, the driving electrode 19 is provided on one principal face of the fourth substrate 21 and the driving electrode 33 for a sensor is provided on the other principal face in a strip-shaped pattern, respectively. On the driving electrode 33 for a sensor, an insulating film 34 formed of, for example, SiO or the like is provided, and therefore, a capacitative element is formed between the driving electrode 33 for a sensor and the detection electrode 22. In addition, a protective film 35 is further provided on the detection electrode 22, and the polarization plate 23 may be adhered onto the protective film 35.

Sixth Embodiment

Figure 22:
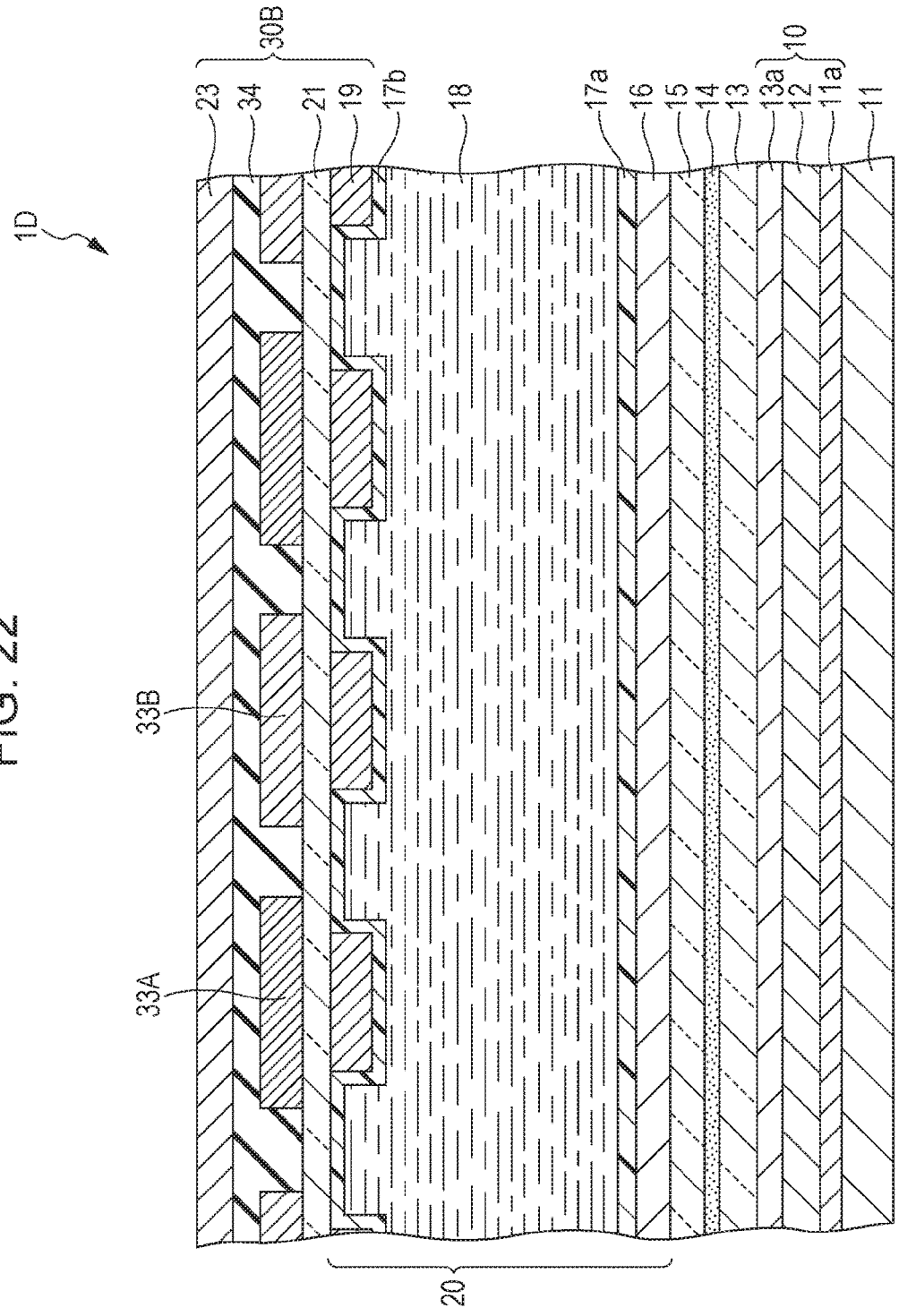
FIG. 22 is a cross-sectional diagram illustrating a schematic structure of a display device according to a sixth modification example.

FIG. 22 illustrates a cross-sectional structure of a display device (a display device 1D) according to a sixth modification example. In the display device 1D, in regard to a touch sensor portion 30B, a driving electrode 33A for a sensor and a detection electrode 33B are provided in the same layer as each other in one surface side (a side opposite to the driving electrode 19) of the fourth substrate 21 and are covered with the insulating film 34. That is, on the fourth substrate 21, the driving electrode 33A for a sensor and the detection electrode 33B are arranged on the same surface in a predetermined pattern in a state of being insulated from each other, and therefore a capacitative element is formed between the driving electrode 33A for a sensor and the detection electrode 33B. The polarization plate 23 may be adhered onto the insulating film 34.

Similarly to the fifth and sixth modification examples, in regard to an integrated structure in which the liquid crystal lens portion 20 and the touch sensor portion are laminated above the pixel portion 10, the touch sensor portion may be a so-called on-cell structure, and it is not necessarily for the driving electrode to be commonized between the liquid crystal lens portion and the touch sensor portion. In addition, in the above-described modification examples, description has been made with respect to a structure in which all of the second substrate 13, the adhesion layer 14, the third substrate 15, and the counter electrode 16 are laminated as an example, but similarly to a structure described in the second embodiment, and the first and second modification examples, several layers may be omitted or used in common.

APPLICATION EXAMPLES

Next, application examples (first to fifth application examples) of the touch sensor-mounted display device illustrated in the above-described embodiments and modification examples will be described with reference to FIGS. 23 to 27G. The display device of the above-described embodiments or the like is applicable to electronic apparatuses of all fields, for example, portable terminals such as a television device, a digital camera, a note-type personal computer, and a cellular phone, video camera, or the like. In other words, the display device of the above-described embodiments is applicable to electronic apparatuses of all fields in which a video signal input from the outside, or a video signal generated inside is displayed as an image or a video.

First Application Example

Figure 23:
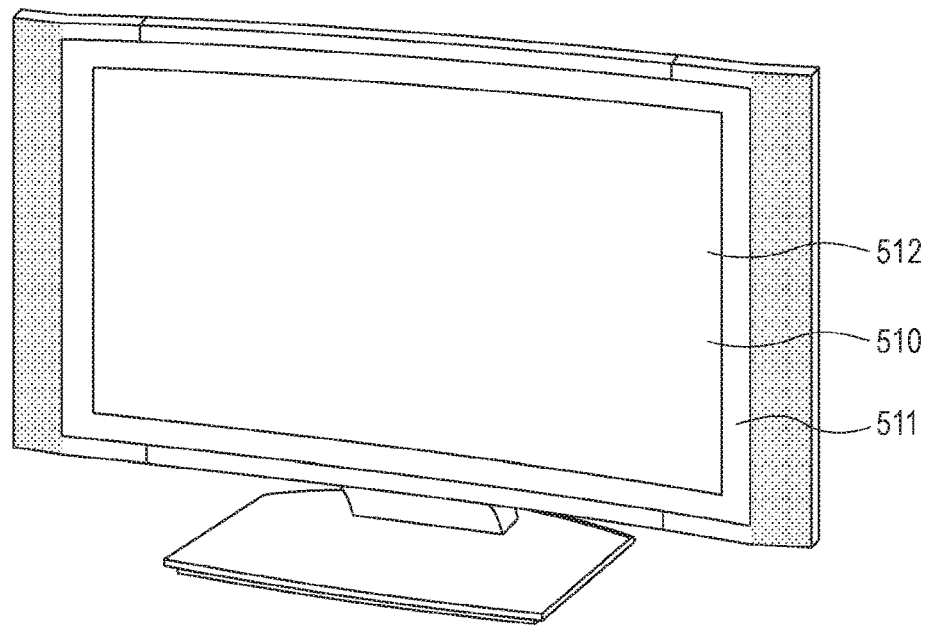

FIG. 23 illustrates an external appearance of a television device according to a first application example. The television device includes, for example, an image display screen portion 510 including a front panel 511 and filter glass 512, and the image display screen portion 510. The image display screen portion 510 corresponds to the display device according to the above-described embodiments or the like.

Second Application Example

Figure 24A:
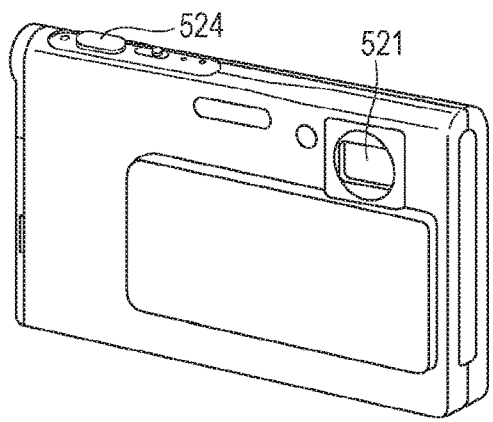
FIG. 24A is a perspective diagram illustrating an external appearance of a second application example, which is seen from a front side.
Figure 24B:
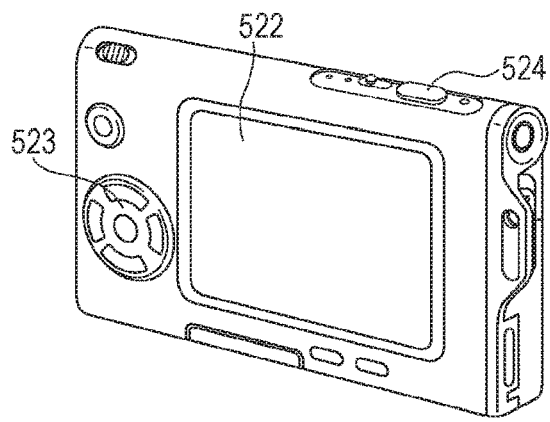
FIG. 24B is a perspective diagram illustrating an external appearance seen from a back side.

FIGS. 24A and 24B illustrate an external appearance of a digital camera according to a second application. The digital camera includes, for example, a light-emitting portion 521 for a flash, a display portion 522, a menu switch 523, and a shutter button 524. The display portion 522 corresponds to the display device according to the above-described embodiments or the like.

Third Application Example

Figure 25:
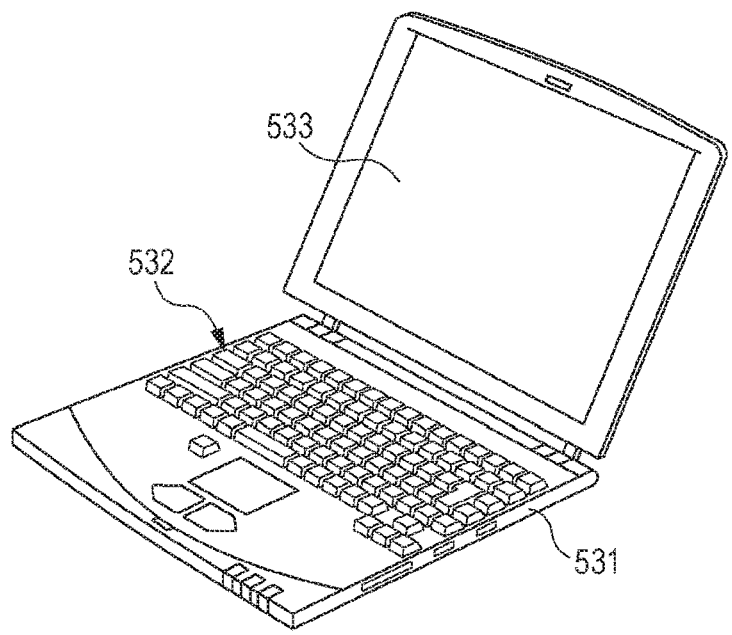
FIG. 25 is a perspective diagram illustrating an external appearance of a third application example.

FIG. 25 illustrates an external appearance of a note-type personal computer according to a third application example. The note-type personal computer includes, for example, a main body 531, a keyboard 532 for an input operation of characters or the like, and a display portion 533 that displays an image. The display portion 533 corresponds to the display device according to the above-described embodiments or the like.

Fourth Application Example

Figure 26:
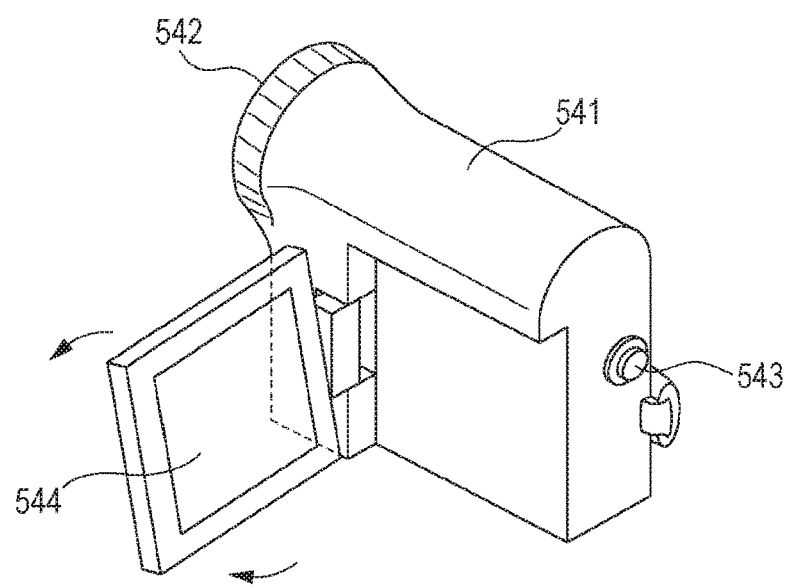
FIG. 26 is a perspective diagram illustrating an external appearance of a fourth application example.

FIG. 26 illustrates an external appearance of a video camera according to a fourth application example. The video camera includes, for example, a main body 541, a lens 542 that is provided at a front-side surface of the main body 541 to take a photograph of subjects, a start and stop switch 543 at the time of taking a photograph, and a display portion 544. The display device 544 corresponds to the display device according to the above-described embodiments or the like.

Fifth Application Example

FIGS. 27A to 27G illustrate an external appearance of a cellular phone according to a fifth application example. The cellular phone includes, for example, an upper casing 710 and a lower casing 720 connected by a connecting portion (a hinge portion) 730, a display 740, a sub-display 750, a picture light 760, and a camera 770. The display 740 or the sub-display 750 corresponds to the display device according to the above-described embodiments or the like.

Hereinbefore, the present disclosure has been described with reference to several embodiments, modification examples, and application examples as an example, but the present disclosure is not limited to the above-described embodiments or the like, and various modifications may occur. For example, the above-described embodiments have a structure in which the display switching function portion and the touch sensor portion are provided in this order above the pixel portion. However, a lamination sequence is not laminated thereto, and for example, the display switching function portion may be provided above the pixel portion with the touch sensor portion interposed therebetween. However, it is preferable that the touch sensor portion be laminated at the outermost surface from the viewpoint of a sensor sensitivity.

In addition, in the above-described embodiments or the like, the organic EL element has been exemplified as a display pixel in the pixel portion 10, but the display pixel is not limited thereto, and for example, may be a liquid crystal display element. In the case of using the liquid crystal display element, an additional backlight may be provided to perform an image display.

Furthermore, in the above-described embodiments or the like, description has been made with respect to a laminated structure in which the driving electrode is used in common between the display switching function portion and the touch sensor portion as an example, but it is not limited to this laminated structure, and the driving electrode may be provided separately in each portion. However, it is preferable that the driving electrode be used in common from the viewpoint of thickness and simplicity of a device.

The present disclosure contains subject matter related to that disclosed in Japanese Priority Patent Application JP 2011-062920 filed in the Japan Patent Office on Mar. 22, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
a pixel portion including a plurality of pixels;
a display switching function portion configured to display an image based on light emitted from the pixel portion, the display switching function portion is capable of switching between a three-dimensional display of the image and a two-dimensional display of the image; and
a sensor portion configured to detect whether or not an object comes into contact with the sensor portion or approaches the sensor portion,
wherein:
the pixel portion includes an organic electroluminescent layer and a common electrode in this order above a plurality of pixel electrodes,
the display switching function portion includes a function layer and a driving electrode in this order above a counter electrode, the function layer allows an emission angle or an emission area of a light beam to vary in response to an applied voltage, and
the sensor portion includes a detection electrode above the driving electrode, a capacitative element being between the driving electrode and the detection electrode,
a driving circuit is configured to output a sensor driving signal to the driving electrode during the three-dimensional display and during the two-dimensional display, the driving circuit is configured to output a 3D display driving signal to the driving electrode during the three-dimensional display at a pulse width that is longer than a pulse width of the sensor driving signal and to output a 2D display driving signal to the driving electrode during the two-dimensional display at a pulse width that is longer than the pulse width of the sensor driving signal.

2. The display device according to claim 1,
wherein the display switching function portion is configured by any one of a liquid crystal lens, a liquid lens, and a barrier parallax.

3. The display device according to claim 2,
wherein the sensor portion is an electrostatic capacitance type touch sensor.

4. The display device according to claim 1,
wherein the display switching function portion and the sensor portion are provided in this order from the pixel portion side.

5. The display device according to claim 1,
wherein the pixel portion is sealed between a first substrate and a second substrate,
the counter electrode is provided above the second substrate with a third substrate interposed therebetween, and
a fourth substrate is provided between the driving electrode for a sensor and the detection electrode.

6. The display device according to claim 1,
wherein the pixel portion is sealed between a first substrate and a second substrate,
the counter electrode is provided directly on the second substrate, and
a fourth substrate is provided between the driving electrode for a sensor and the detection electrode.

7. The display device according to claim 1,
the pixel portion and a protective layer are formed in this order above a first substrate,
the counter electrode is provided on the protective layer, and
a fourth substrate is provided between the driving electrode.

8. The display device according to claim 1,
wherein the common electrode in the pixel portion also serves as the counter electrode in the display switching function portion.

9. The display device according to claim 1,
wherein the common electrode in the pixel portion also serves as the counter electrode in the display switching function portion.

10. The display device according to claim 9,
the pixel portion is provided on a first substrate,
the function layer is provided on the common electrode of the pixel portion, and
a fourth substrate is provided between the driving electrode.

11. The display device according to claim 1,
wherein the driving electrode includes one or a plurality of strip-shaped driving electrodes,
the detection electrode includes one or a plurality of strip-shaped detection electrodes that extend in a direction intersecting the strip-shaped driving electrodes.

12. The display device according to claim 1,
wherein the display switching function portion is a liquid crystal lens, and
a liquid crystal layer in which a refraction index varies in response to an applied voltage is provided as the function layer.

13. The display device according to claim 1,
wherein the display switching function portion is a liquid lens, and
a polar liquid layer and a nonpolar liquid layer in which a shape of an interface therebetween varies in response to an applied voltage are provided as the function layer.

14. The display device according to claim 1,
wherein the display switching function portion is a liquid crystal barrier, and
a liquid crystal layer, which is capable of switching transmission and interception of a selective area in response to an applied voltage, is provided as the function layer.

15. The display device according to claim 1,
a detection circuit configured to perform an object detection process based on a detection signal obtained from the detection electrode, the sensor driving signal being transferred onto the detection electrode to become the detection signal.

16. The display device according to claim 1,
the plurality of pixels is to be driven by the 2D display driving signal during the two-dimensional display and by the 3D display driving signal during the three-dimensional display.

17. An electronic apparatus comprising:
the display device according to claim 1.

\* \* \* \* \*